(12) United States Patent
Diep et al.

(10) Patent No.: US 10,510,413 B1
(45) Date of Patent: Dec. 17, 2019

(54) MULTI-PASS PROGRAMMING WITH MODIFIED PASS VOLTAGES TO TIGHTEN THRESHOLD VOLTAGE DISTRIBUTIONS

(71) Applicant: SanDisk Technologies LLC, Addison, TX (US)

(72) Inventors: Vinh Diep, San Jose, CA (US); Ching-Huang Lu, Fremont, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/057,423

(22) Filed: Aug. 7, 2018

(51) Int. Cl.
| | |
|---|---|
| G11C 16/04 | (2006.01) |
| G11C 16/24 | (2006.01) |
| G11C 16/34 | (2006.01) |
| G11C 16/08 | (2006.01) |
| G11C 16/28 | (2006.01) |
| G11C 16/16 | (2006.01) |

(52) U.S. Cl.
CPC .......... *G11C 16/0483* (2013.01); *G11C 16/08* (2013.01); *G11C 16/16* (2013.01); *G11C 16/24* (2013.01); *G11C 16/28* (2013.01); *G11C 16/34* (2013.01)

(58) Field of Classification Search
CPC ...... G11C 16/0483; G11C 16/08; G11C 16/16
USPC .................................................. 365/185.17
See application file for complete search history.

(56) References Cited

U.S. PATENT DOCUMENTS

| | | | |
|---|---|---|---|
| 7,286,408 B1 * | 10/2007 | Higashitani | G11C 16/3418 365/185.18 |
| 7,436,709 B2 | 10/2008 | Higashitani | |
| 7,839,687 B2 | 11/2010 | Dutta et al. | |
| 8,051,240 B2 | 11/2011 | Dutta et al. | |
| 9,123,424 B2 | 9/2015 | Oowada et al. | |
| 9,349,478 B2 | 5/2016 | Yuan et al. | |
| 9,466,369 B1 | 10/2016 | Pang et al. | |
| 9,583,198 B1 | 2/2017 | Pang et al. | |
| 2008/0089128 A1 | 4/2008 | Mokhlesi et al. | |
| 2008/0159002 A1 * | 7/2008 | Dong | G11C 11/5628 365/185.25 |
| 2009/0310414 A1 | 12/2009 | Lee et al. | |
| 2013/0077408 A1 | 3/2013 | Ueno | |
| 2014/0192594 A1 * | 7/2014 | Lue | G11C 16/10 365/185.11 |

(Continued)

OTHER PUBLICATIONS

U.S. Appl. No. 15/948,761, filed Apr. 9, 2018 by Diep et al.

(Continued)

*Primary Examiner* — Vu A Le
(74) *Attorney, Agent, or Firm* — Vierra Magen Marcus LLP

(57) ABSTRACT

Apparatuses and techniques are described for programming memory cells with a narrow threshold voltage (Vth) distribution in a memory device. In a first program pass of a multi-pass program operation, pass voltages of the word lines adjacent to a selected word line are adjusted to increase electron injection in a portion of a charge-trapping layer between the selected word line and an adjacent source side unselected word line. In a second, final program pass of the multi-pass program operation, the pass voltages are adjusted to reduce electron injection in the portion of the charge-trapping layer between the selected word line and the adjacent source side unselected word line.

19 Claims, 21 Drawing Sheets

(56) References Cited

U.S. PATENT DOCUMENTS

2015/0170746 A1 6/2015 Oowada et al.
2016/0071595 A1 3/2016 Dong et al.

OTHER PUBLICATIONS

International Search Report & The Written Opinion of the International Searching Authority dated Sep. 24, 2019, International Application No. PCT/US2019/033908.

\* cited by examiner

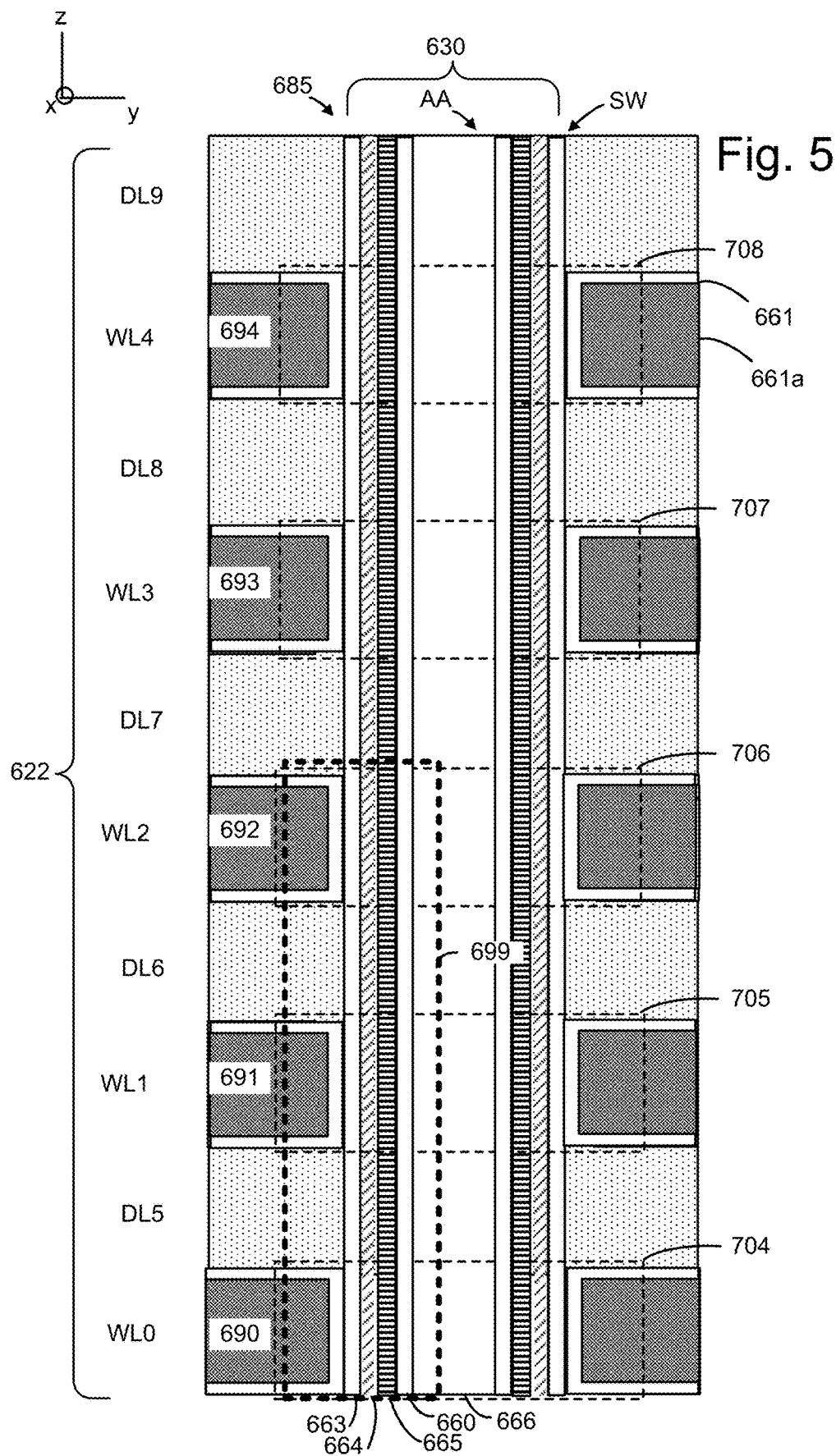

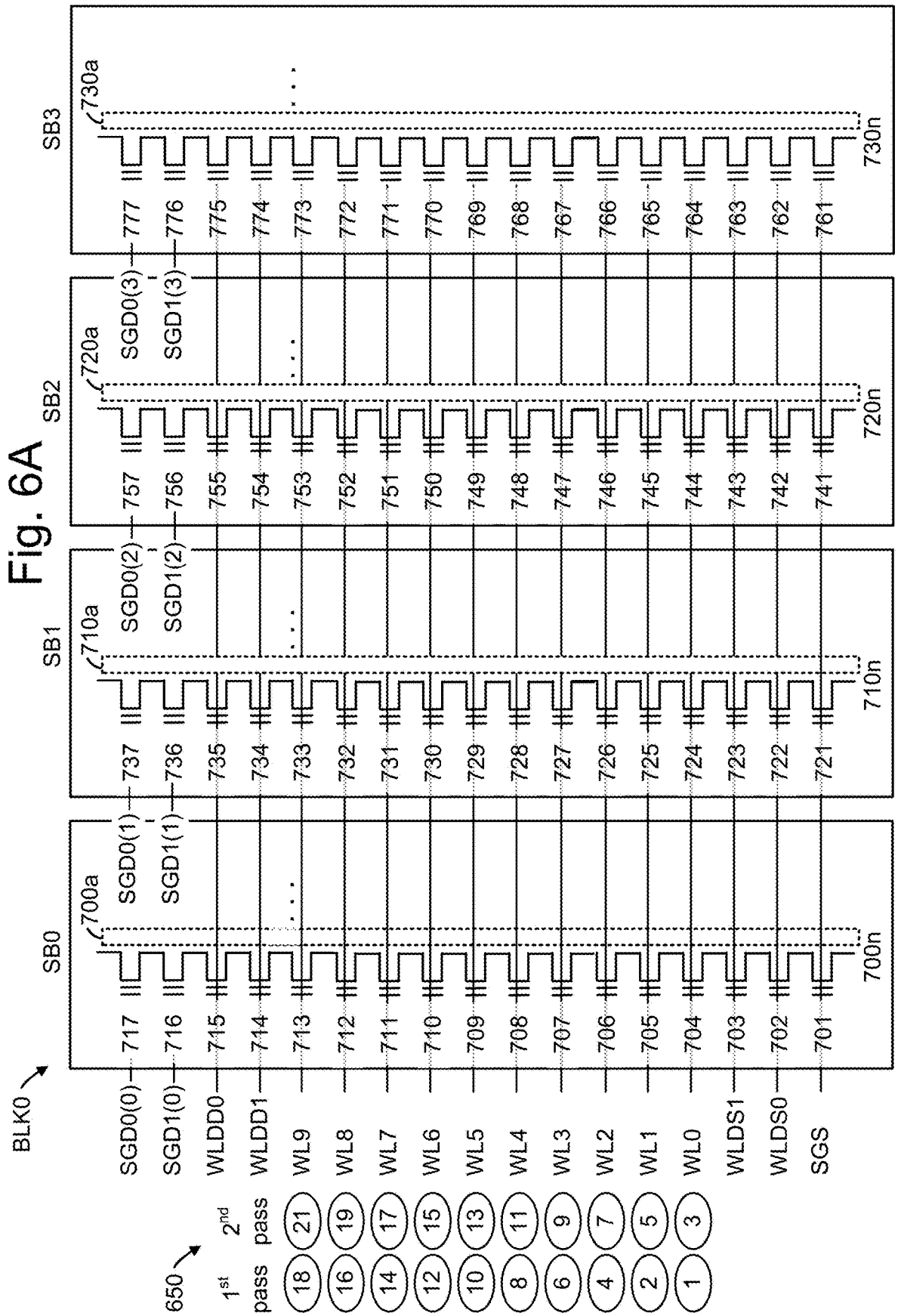

Fig. 6B
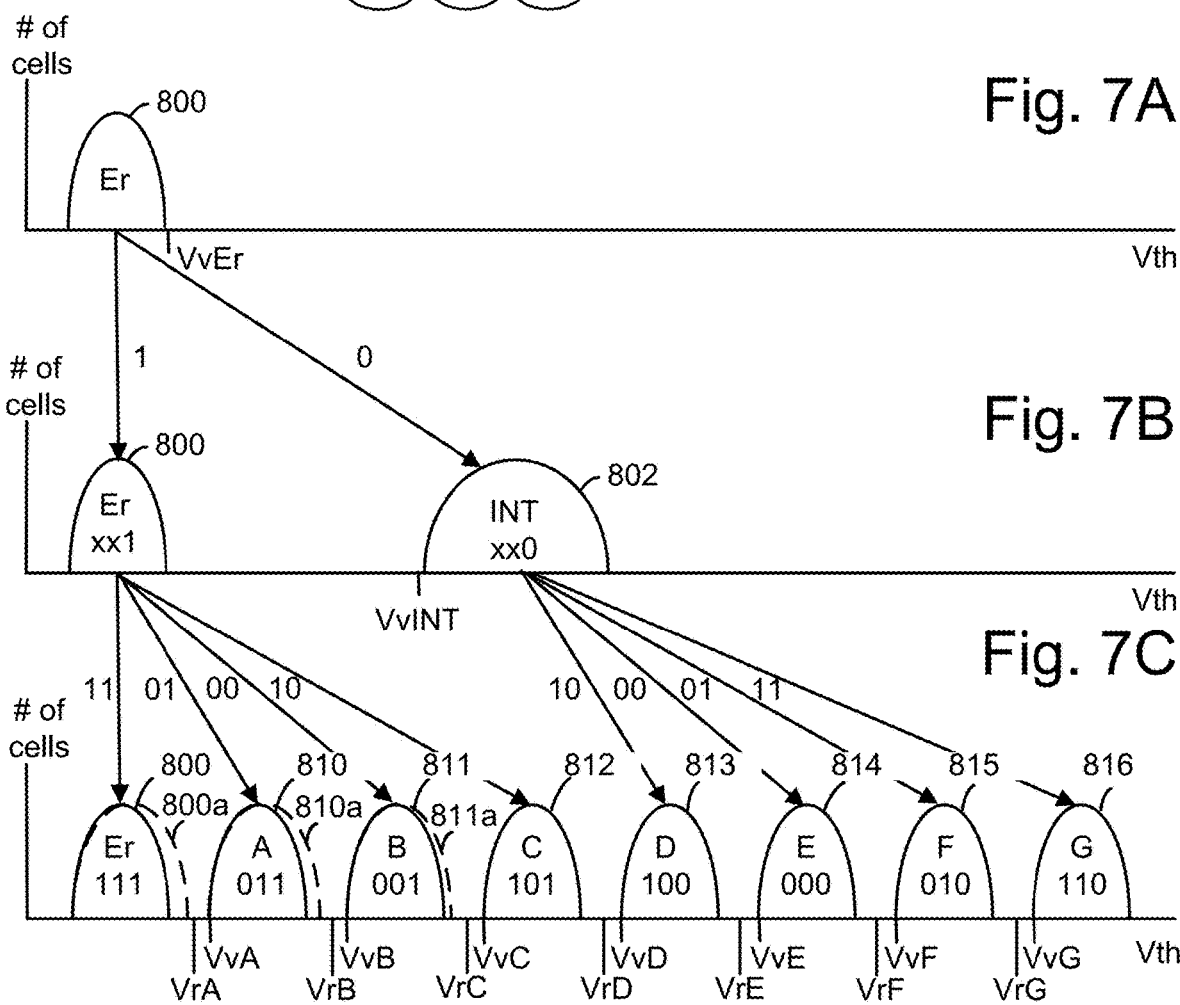
Fig. 7A
Fig. 7B
Fig. 7C

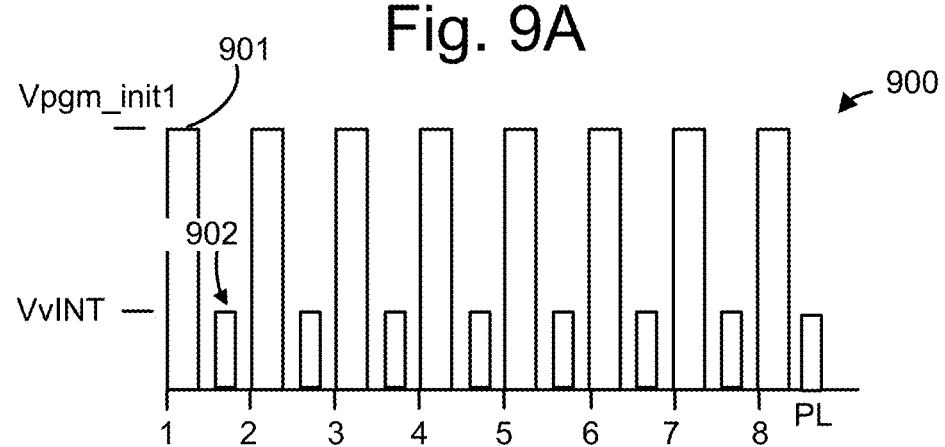
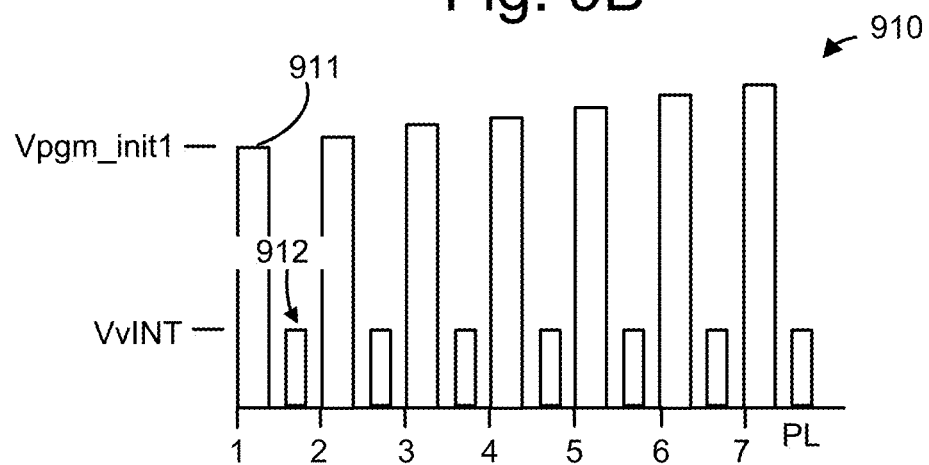

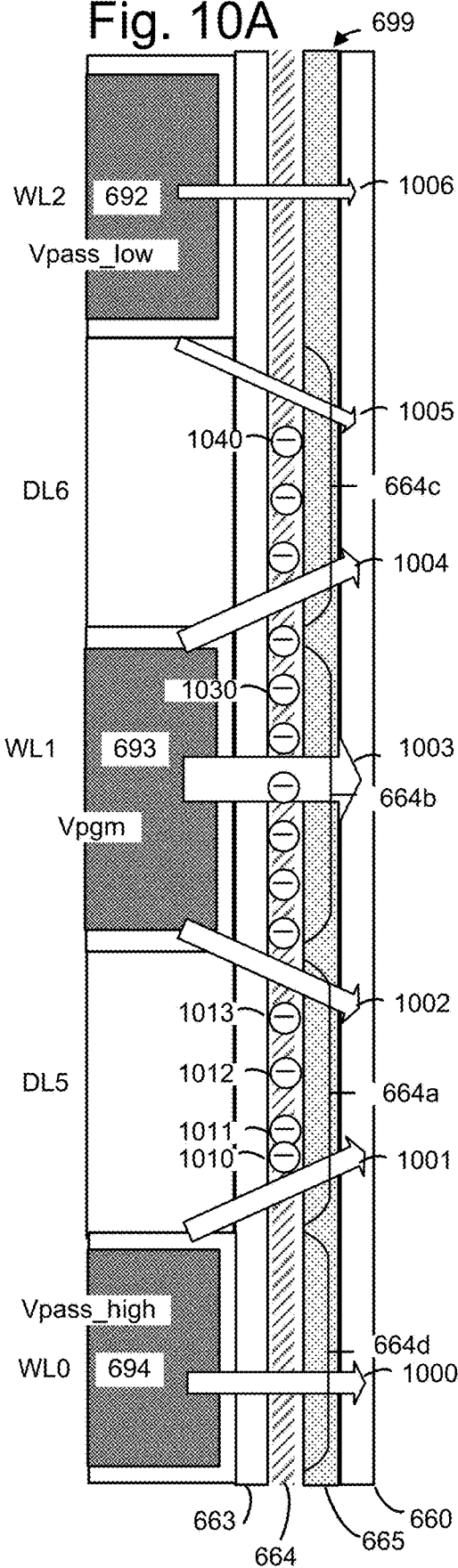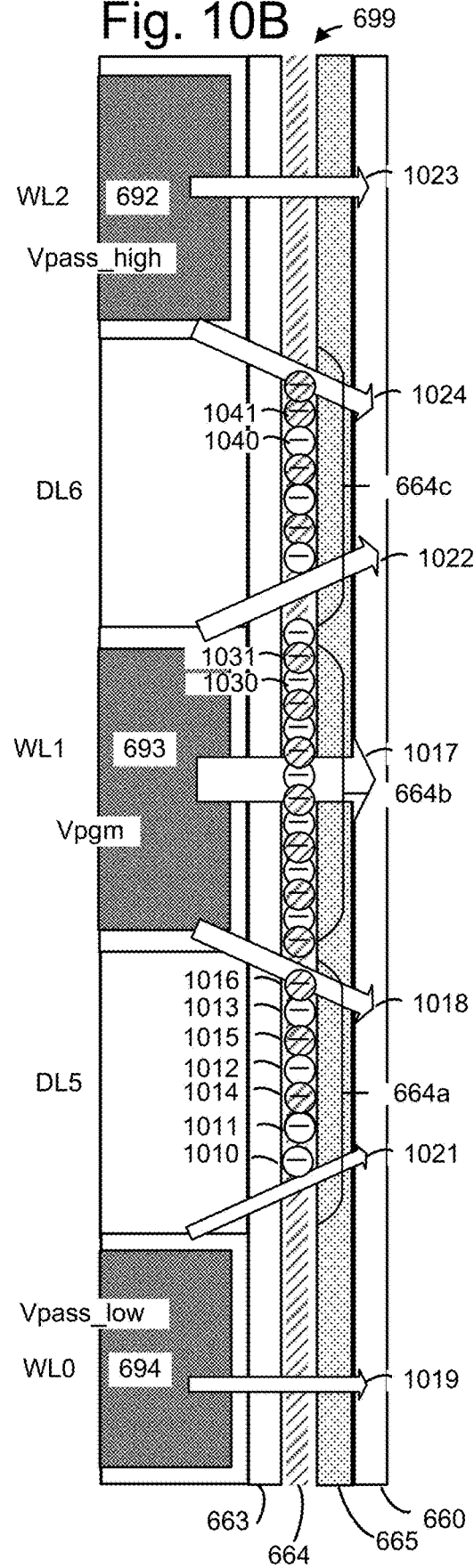

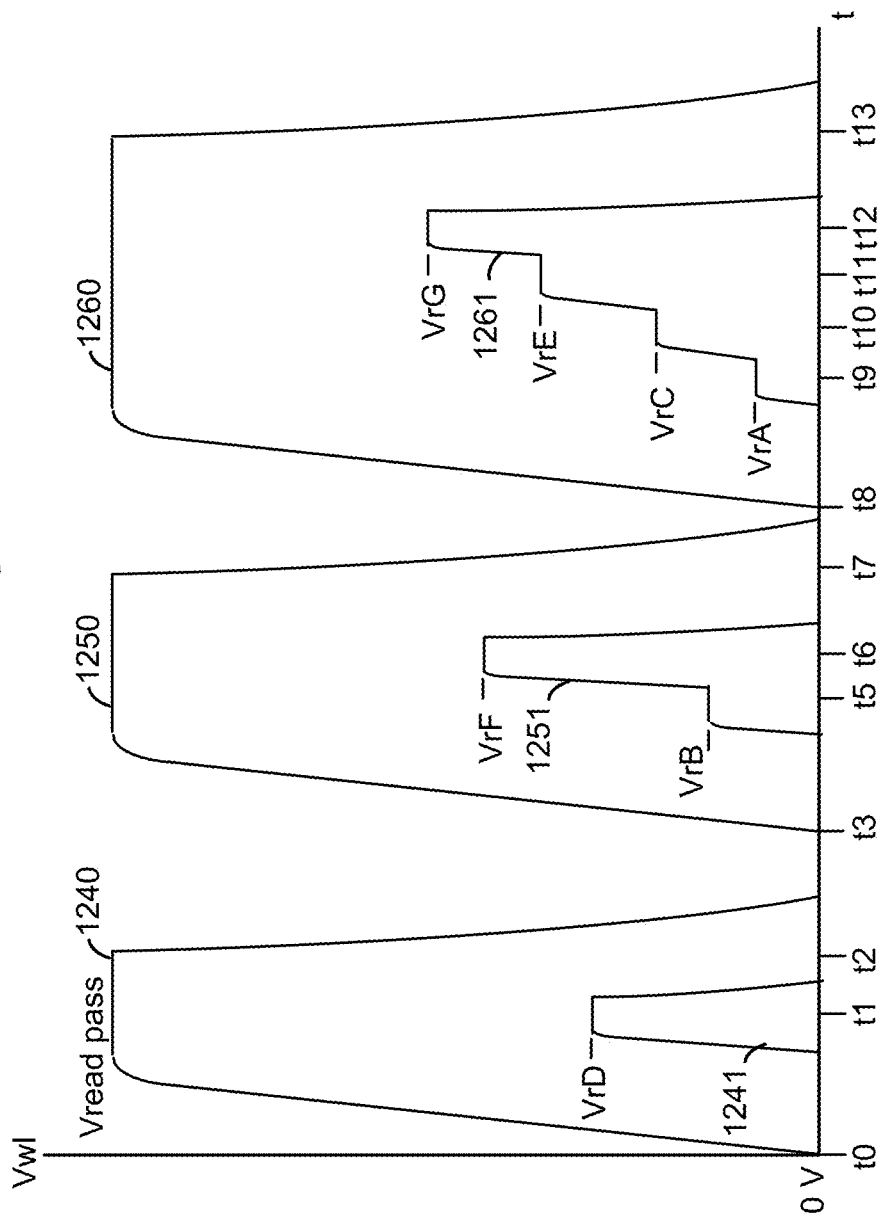

Fig. 13

|  |  | ② | ③ | ④ | ⑤ |
|---|---|---|---|---|---|
|  | WL9 | Vpass_high | Vpass_high | Vpass_high | Vpass_high |
|  | WL8 | Vpass_high | Vpass_high | Vpass_high | Vpass_high |
|  | WL7 | Vpass_high | Vpass_high | Vpass_high | Vpass_high |
|  | WL6 | Vpass_high | Vpass_high | Vpass_high | Vpass_high |
|  | WL5 | Vpass_high | Vpass_high | Vpass_high | Vpass_high |
|  | WL4 | Vpass_high | Vpass_high | Vpass_high | Vpass_high |
|  | WL3 | Vpass_high | Vpass_high | Vpass_low | Vpass_high |
| WLn+1 | WL2 | Vpass_low | Vpass_high | Vpgm | Vpass_high |
| WLn | WL1 | Vpgm | Vpass_high | Vpass_high | Vpgm |
| WLn-1 | WL0 | Vpass_high | Vpgm | Vpgm_high | Vpgm_low |

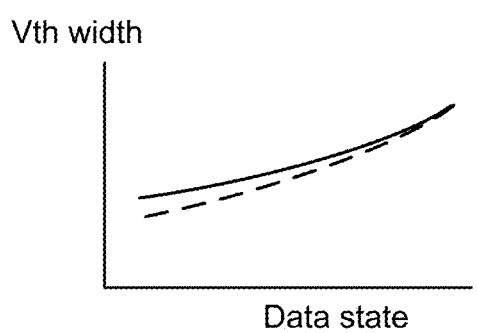

Fig. 14A

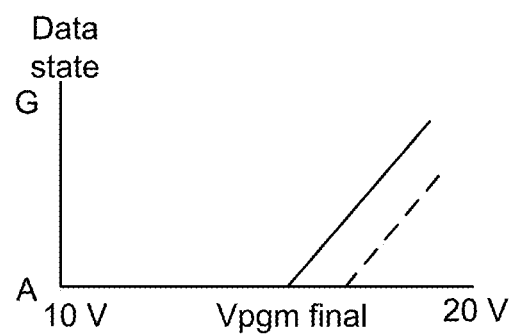

Fig. 14B

| | 1st pass Vpass s/d | 2nd pass Vpass s/d |
|---|---|---|
| Case 1 | high/high | high/high |
| Case 2 | low/high | low/high |
| Case 3 | high/low | high/high |
| Case 4 | high/low | low/high |
| Case 5 | low/low | high/high |
| Case 6 | low/low | low/high |

| | 1st pass Vpass s/d | Vpgm final | SUM1 | 2nd pass Vpass s/d | Vpgm final | SUM2 | SUM2-SUM1 |
|---|---|---|---|---|---|---|---|
| Case 1 | 10/10 | 14 | 24 | 10/10 | 20 | 30 | 6 |
| Case 2 | 6/10 | 15 | 21 | 6/10 | 21 | 27 | 6 |
| Case 3 | 10/6 | 15 | 25 | 10/10 | 20 | 30 | 5 |
| Case 4 | 10/6 | 15 | 25 | 6/10 | 21 | 27 | 2 |
| Case 5 | 6/6 | 16 | 22 | 10/10 | 20 | 30 | 8 |
| Case 6 | 6/6 | 16 | 22 | 6/10 | 21 | 27 | 5 |

MULTI-PASS PROGRAMMING WITH MODIFIED PASS VOLTAGES TO TIGHTEN THRESHOLD VOLTAGE DISTRIBUTIONS

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in series, in NAND chains (e.g., NAND strings), for instance, where select gate transistors are provided at the ends of a NAND string to selectively connect a channel of the NAND string to a source line or bit line. However, various challenges are presented in operating such memory devices.

BRIEF DESCRIPTION OF THE DRAWINGS

FIG. 5B depicts a close-up view of the region 622 of the stack of FIG. 5A.

FIG. 6A depicts an example view of NAND strings in BLK0 which is consistent with FIGS. 4 and 5A, and an example word line programming order for a two-pass program operation.

FIG. 6B depicts an example word line programming order for a three-pass program operation using BLK0 of FIG. 6A.

FIG. 7A to 7C depict an example of a two-pass program operation, where FIG. 7A depicts a starting Vth distribution, FIG. 7B depicts a Vth distribution after a first program pass and FIG. 7C depicts a Vth distribution after a second program pass.

FIG. 8A depicts a starting Vth distribution, FIG. 8B depicts a Vth distribution after a first program pass, FIG. 8C depicts a Vth distribution after a second program pass, and FIG. 8D depicts a Vth distribution after a third program pass, consistent with FIG. 6B.

FIG. 9A depicts an example of a voltage signal used in the first program pass of FIG. 7B.

FIG. 9B depicts another example of a voltage signal used in the first program pass of FIG. 7B.

FIG. 10A depicts the portion 699 of a stack of FIG. 5B, in a first program pass using asymmetric boosting with a high source side pass voltage and a low drain side pass voltage.

FIG. 10B depicts the portion 699 of a stack of FIG. 10A, in a second program pass using asymmetric boosting with a low source side pass voltage and a high drain side pass voltage.

FIG. 12C depicts example waveforms in a read operation, consistent with the read process of FIG. 11E.

FIG. 13 depicts example voltages applied to the word lines of a block in a two pass program operation, consistent with steps 2-5 of the block of FIG. 6A and the program process of FIG. 11A.

FIG. 14A depicts a plot of Vth width versus data state, comparing the process of FIG. 11A with a comparative example.

FIG. 14B depicts a plot of data state or Vth versus a final Vpgm, comparing the process of FIG. 11A with a comparative example.

DETAILED DESCRIPTION

Figure 1:
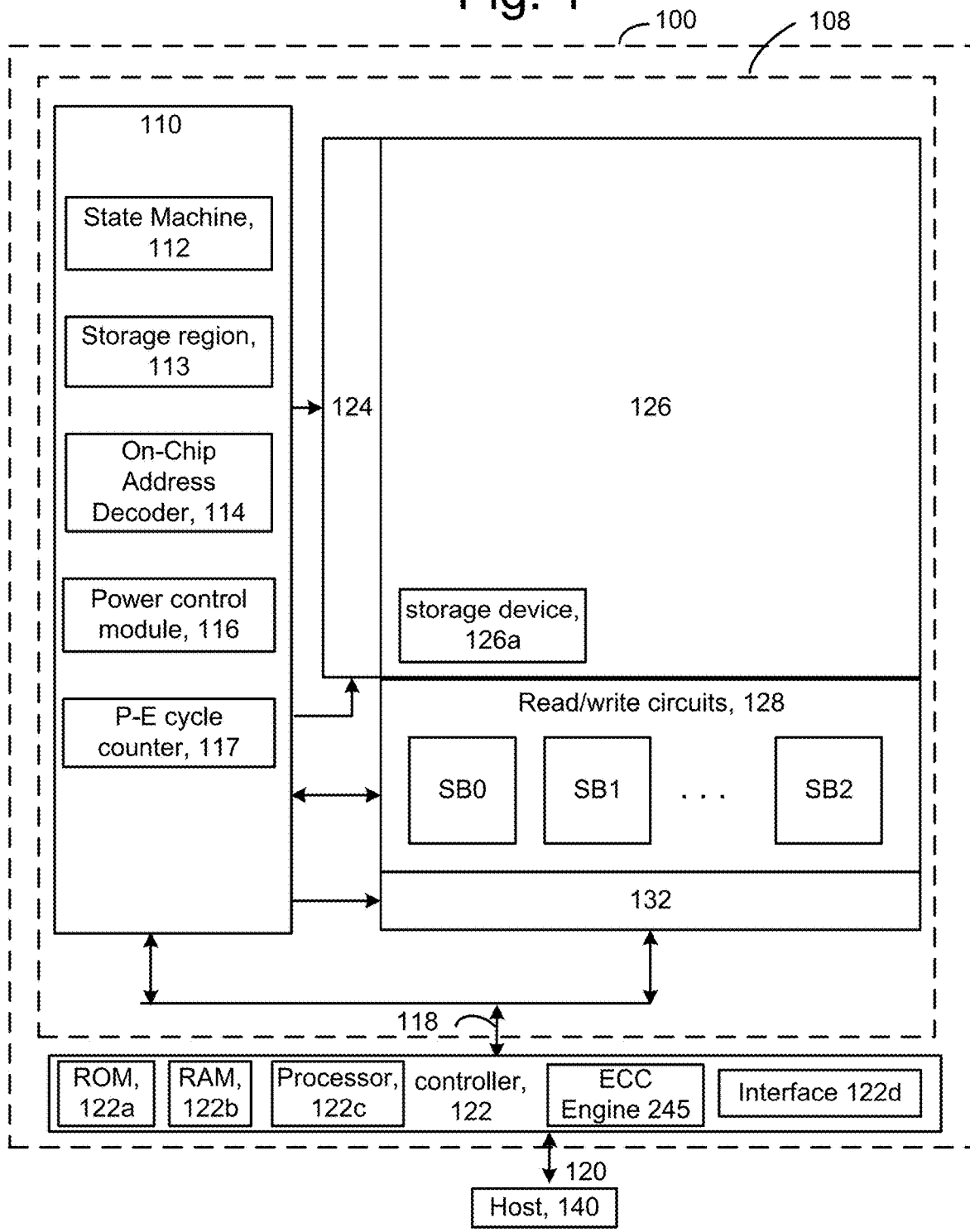
FIG. 1 is a block diagram of an example memory device.

Apparatuses and techniques are described for multi-pass programming of memory cells with a narrow threshold voltage (Vth) distribution.

In some memory devices, memory cells are joined to one another such as in NAND strings in a block or sub-block. Each NAND string comprises a number of memory cells connected in series between one or more drain-end select gate transistors (referred to as SGD transistors), on a drain-end of the NAND string which is connected to a bit line, and one or more source-end select gate transistors (referred to as SGS transistors), on a source-end of the NAND string or other memory string or set of connected memory cells which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

In a 3D memory structure, the memory cells may be arranged in vertically extending NAND strings in a stack, where the stack comprises alternating conductive and dielectric layers. The conductive layers act as word lines which are connected to the memory cells. Each NAND string may have the shape of a pillar which intersects with the word lines to form the memory cells.

The memory cells can include data memory cells, which are eligible to store user data, and dummy or non-data memory cells which are ineligible to store user data. A dummy memory cell may have the same construction as a data memory cell but is considered by the controller to be ineligible to store any type of data including user data. A dummy word line is connected to a dummy memory cell. One or more dummy memory cells may be provided at the drain and/or source ends of a string of memory cells to provide a gradual transition in the channel voltage gradient.

Each memory cell may be assigned to a data state according to write data in a program command. Based on the write data, a memory cell will either remain in the erased state or be programmed to an assigned, programmed data state. For example, in a one bit per cell memory device, there are two data states including the erased state and the programmed state. In a two-bit per cell memory device, there are four data states including the erased state and three higher data states referred to as the A, B and C data states. In a three-bit per cell memory device, there are eight data states including the erased state and seven higher data states referred to as the A, B, C, D, E, F and G data states (see FIG. 7C). In a four-bit per cell memory device, there are sixteen data states including the erased state and fifteen higher data states.

After the memory cells are programmed, the data can be read back in a read operation. A read operation can involve applying a series of read voltages to a word line while sensing circuitry determines whether cells connected to the word line are in a conductive (turned on) or non-conductive (turned off) state. If a cell is in a non-conductive state, the Vth of the memory cell exceeds the read voltage. The read voltages are set at levels which are expected to be between the threshold voltage levels of adjacent data states. During the read operation, the voltages of the unselected word lines are ramped up to a read pass level which is high enough to place the unselected memory cells in a strongly conductive state, to avoid interfering with the sensing of the selected memory cells.

Figure 9C:
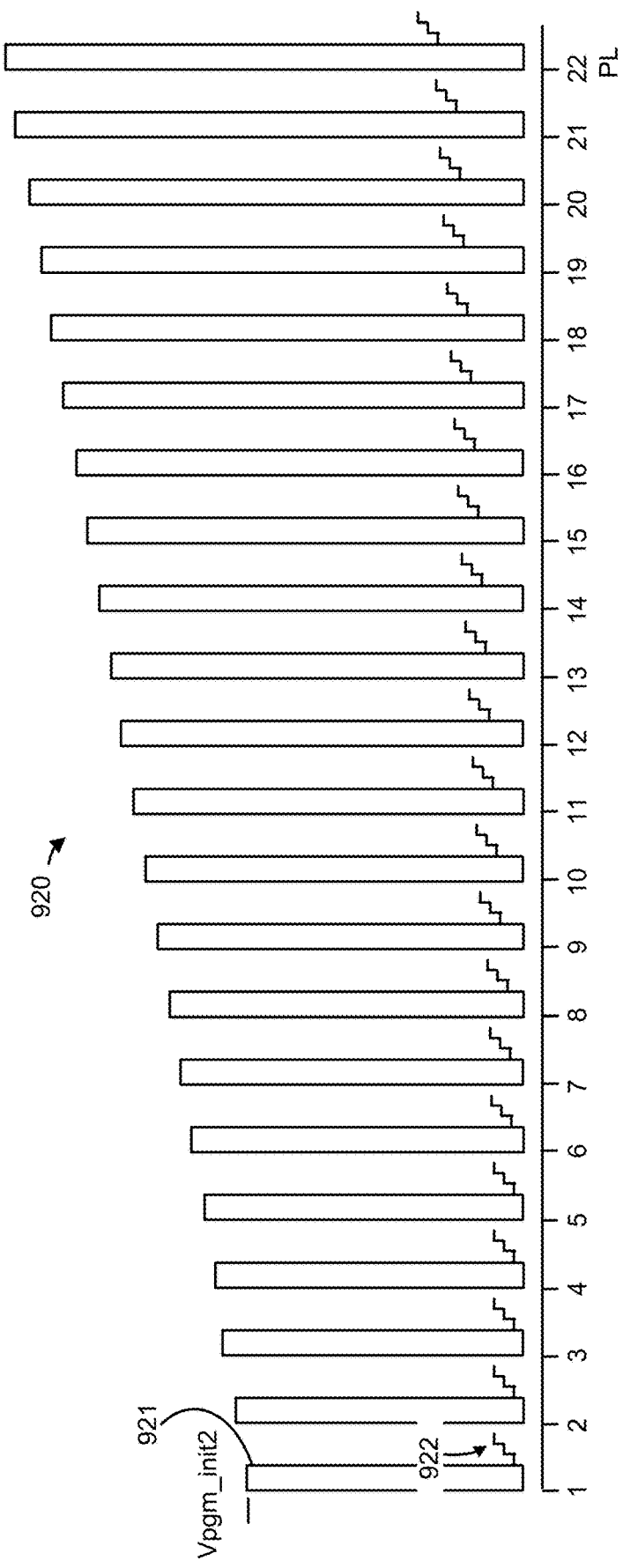
FIG. 9C depicts an example of a voltage signal used in the second program pass of FIG. 7C.

The memory cells can be programmed in one or more program passes. A program pass may include a set of program voltages which are applied to the word line in respective program loops or program-verify iterations, such as depicted in FIG. 9A to 9C. When each program voltage is applied to the selected word line, the voltages of the unselected word lines are increased from an initial level such as 0 V to a pass voltage such as 8-10 V. This increase boosts the channel voltage of the unselected NAND strings to help prevent program disturb when the program voltage is applied. Verify operations (verify tests) may be performed after each program voltage to determine whether the memory cells have completed programming.

A verify test can involve applying a series of verify voltages to a word line while sensing circuitry determines whether cells connected to the word line are in a conductive or non-conductive state. If a cell is in a non-conductive state, the Vth of the memory cell exceeds the verify voltage. When programming is completed for a memory cell, the associated NAND string can be locked out from further programming while programming continues for other memory cells in subsequent program loops.

The memory cells may also be programmed according to a sub-block programming order, where memory cells connected to a word line are programmed in one sub-block, then a next sub-block and so forth.

During a program operation, the memory cells are programmed according to a word line programming order. For example, the programming may start at the word line at the source side of the block and proceed to the word line at the drain side of the block. In one approach, each word line is completely programmed in one program pass before programming a next word line. For example, a first word line, WL0, is programmed then a second word line, WL1, is programmed, and so forth. However, the programming of a word line (e.g., WL1) can cause neighbor word line interference for the adjacent, previously programmed word line (e.g., WL0). In particular, due to capacitive coupling, the memory cells connected to WL0 can have their Vth shifted higher due to increases in the Vth of the memory cells connected to WL1, as well as due to the program voltage applied to WL1. In addition to neighbor word line interference, program disturb can occur during a program operation. Program disturb involves an increase in the Vth of unselected memory cells connected to a selected word line when a program voltage is applied.

To reduce both neighbor word line interference and program disturb, a multi-pass program operation may be performed, e.g., using two or three program passes. For example, when two program passes are used, the memory cells of WLn are partly programmed in a first or other pre-final program pass, then the memory cells of one or more other word lines such as WLn−1 and/or WLn+1 are programmed, and then the memory cells of WLn complete programming in a second or other final program pass. This approach involves a back and forth word line programming order. See FIGS. 6A and 6B for examples of two and three pass program operations, respectively.

However, the Vth distributions of the memory cells can still be shifted higher due to neighbor word line interference and program disturb. The upshift can be high enough to cause read errors.

Techniques provided herein address the above and other issues. In one approach, the pass voltages of word lines which are adjacent to a selected word line are adjusted in the first program pass (or other pre-final program pass, which is before the final program pass) to encourage the injection of electrons into an inter-word line or inter-cell area on the source side of the selected memory cells. This adjustment can involve using a relatively high pass voltage on the source side adjacent word lines. The pass voltages are also adjusted in the second (or other final) program pass to discourage the injection of electrons into the inter-cell area on the source side of the selected memory cells. This adjustment can involve using a relatively low pass voltage on the source side adjacent word lines. A compensating adjustment can be made to the pass voltage of the drain side adjacent word line as well. For example, the pass voltage of the drain side adjacent word line can be made relatively low or high when the source side adjacent word line is relatively high or low, respectively. Applying a relatively low pass voltage to the drain side adjacent word line when the pass voltage of the source side adjacent word line is relatively high can avoid increasing program disturb. Applying a relatively high pass voltage to the drain side adjacent word line when the pass voltage of the source side adjacent word line is relatively low can avoid increasing the number of program loops which are needed to complete a program pass. This avoids increasing the overall program time.

As a result, a narrow final Vth distribution can be achieved since widening of the upper tail of the Vth distributions is reduced.

The above-mentioned techniques may involve asymmetric boosting of a NAND string channel, in which the pass voltages differ on the drain side and source side adjacent word lines of the selected word line.

Figure 5A:
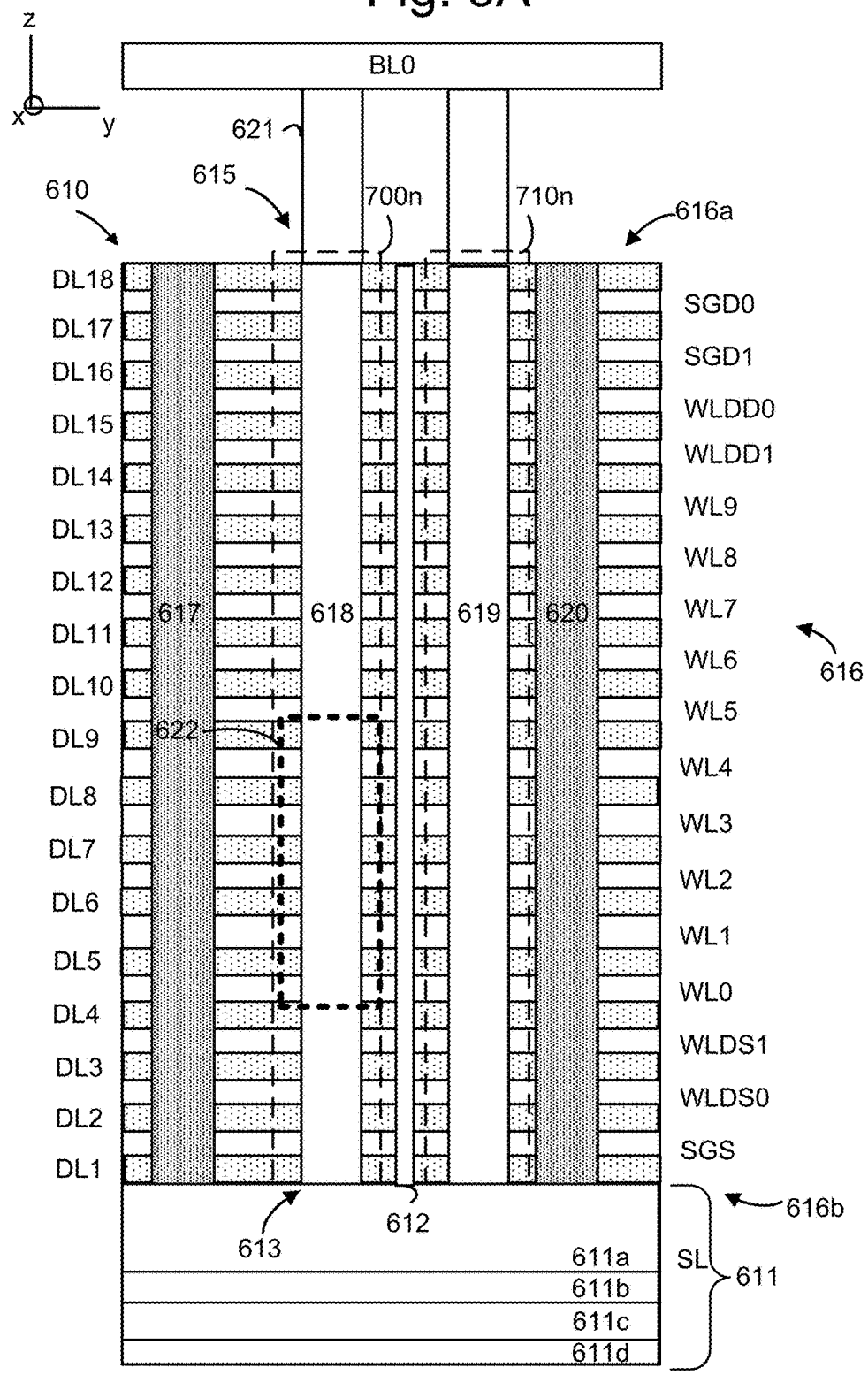
FIG. 5A depicts an example cross-sectional view of a portion of the block BLK0 of FIG. 4.

In another approach, the asymmetric boosting is used when the selected word line is in a bottom portion of a stack, such as the stack 610 of FIG. 5A. Symmetric boosting may be used when the selected word line is in a top portion of the stack. With symmetric boosting, the pass voltages are equal or substantially the same on the drain side and source side adjacent word lines of the selected word line. When the selected word line is relatively high in the stack, there are relatively more programmed memory cells below the selected word line in a NAND string. As a result, boosting of the channel is more difficult, and the use of asymmetric boosting, with a lower pass voltage on one side of the selected word line, can result in inadequate boosting and increased program disturb. In contrast, symmetric boosting, with relatively high source and drain side pass voltages, can provide better channel boosting.

In another approach, the stack is divided into a bottom portion, a midrange portion and a top portion, and there is a transition between strongly asymmetric boosting in the bottom portion, weakly asymmetric boosting in the midrange portion and symmetric boosting in the top portion.

The techniques may be used for both 2D memory devices in which NAND strings extend horizontally, and 3D memory devices in which NAND strings extend vertically.

These and other features are discussed further below.

FIG. 1 is a block diagram of an example memory device. The memory device 100, such as a non-volatile storage system, may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks SB0, SB1, SB2 (sensing circuitry) and allow a page of memory cells to be read or programmed in parallel. Typically a controller 122 is included in the same memory device 100 (e.g., a removable storage card) as the one or more memory die 108. The controller may be separate from the memory die. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, a power control module 116 (power control circuit), and a program erase (P-E) cycle counter 117. The state machine 112 provides chip-level control of memory operations. A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control module 116 controls the power and voltages supplied to the word lines, select gate lines, bit lines and source lines during memory operations. It can include drivers for word lines, SGS and SGD transistors and source lines. The sense blocks can include bit line drivers, in one approach. See also FIG. 3.

Figure 15B:
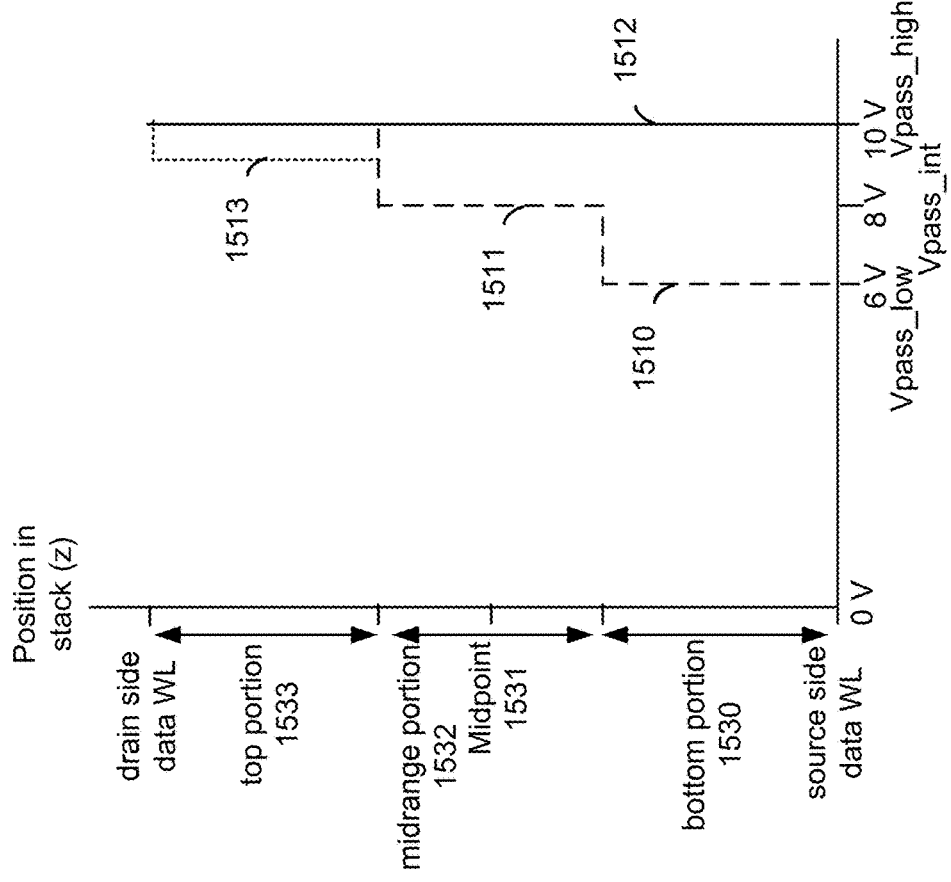
FIG. 15B depicts a plot of a selected word line position in a stack versus a pass voltage, consistent with the process of FIG. 11D, where the stack is divided into three portions.
Figure 15A:
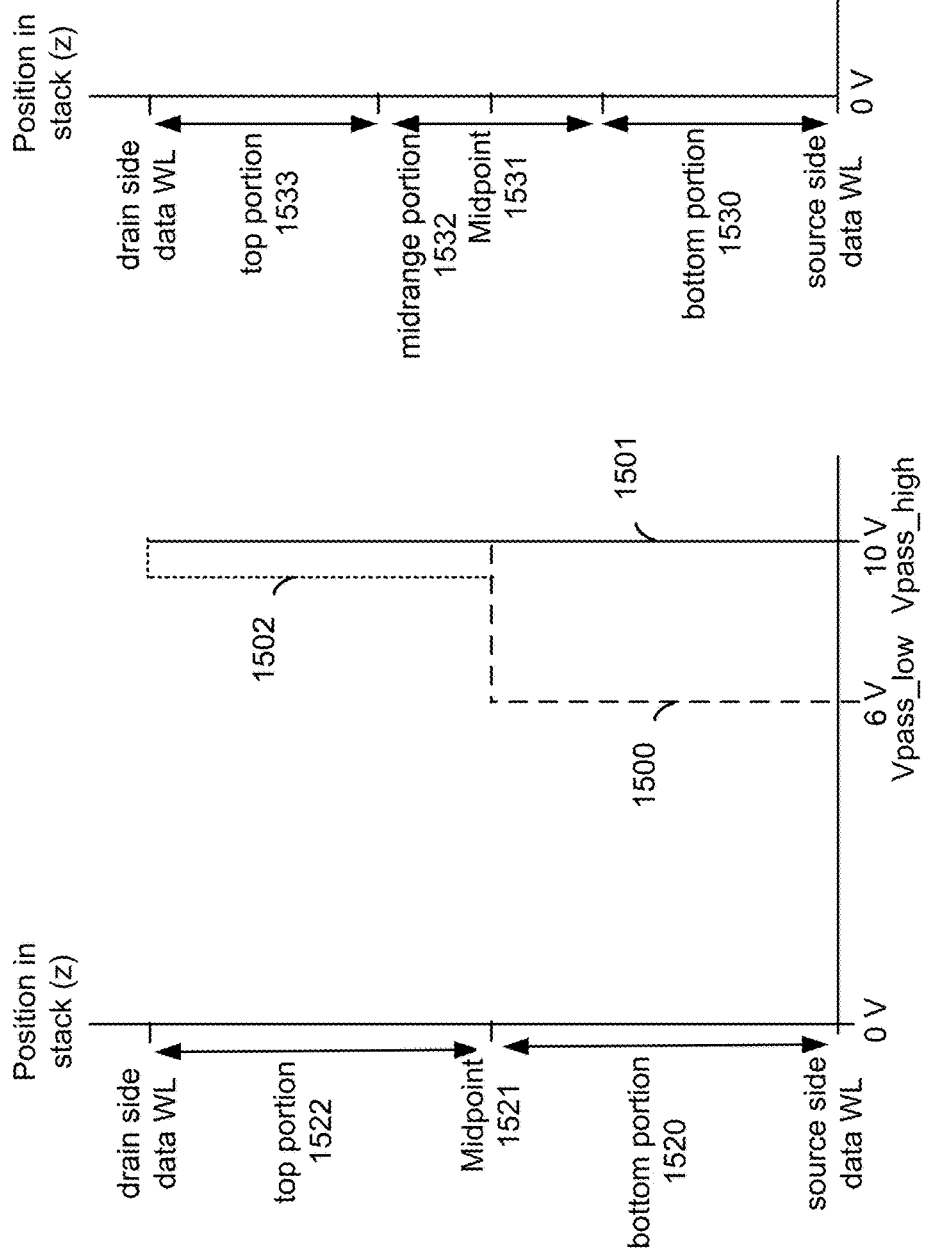
FIG. 15A depicts a plot of a selected word line position in a stack versus a pass voltage, consistent with the process of FIG. 11C, where the stack is divided into two portions.
Figures 15C, 16A, 16B:
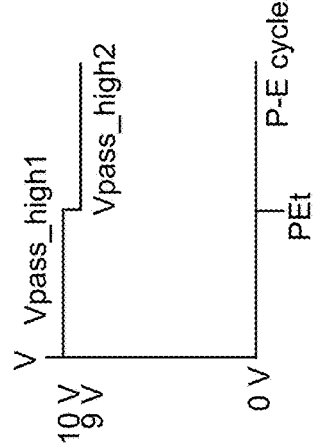
FIG. 15C depicts a plot showing a variation in Vpass_high as a function of a number of program erase (P-E) cycles, consistent with FIGS. 15A and 15B.
FIG. 16A is a table depicting different cases of pass voltages in first and second program passes.
FIG. 16B is a table indicating how the number of electrons injected between WLn and WLn−1 varies in the first and second program passes for the different cases of FIG. 16A.

The (P-E) cycle counter 117 may also track P-E cycles in a block for use in adjusting pass voltages during a program operation, such as depicted in FIG. 15C. This adjustment can compensate for changes in memory cell performance as P-E cycles increase.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control module 116, sense blocks SB0, SB1, SB2, read/write circuits 128, controller 122, and so forth.

The off-chip controller 122 (which in one embodiment is an electrical circuit) may comprise a processor 122c, storage devices (memory) such as ROM 122a and RAM 122b and an error-correction code (ECC) engine 245. The ECC engine can correct a number of read errors.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The techniques described herein are applicable to both 2D and 3D memory structures. The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 2:
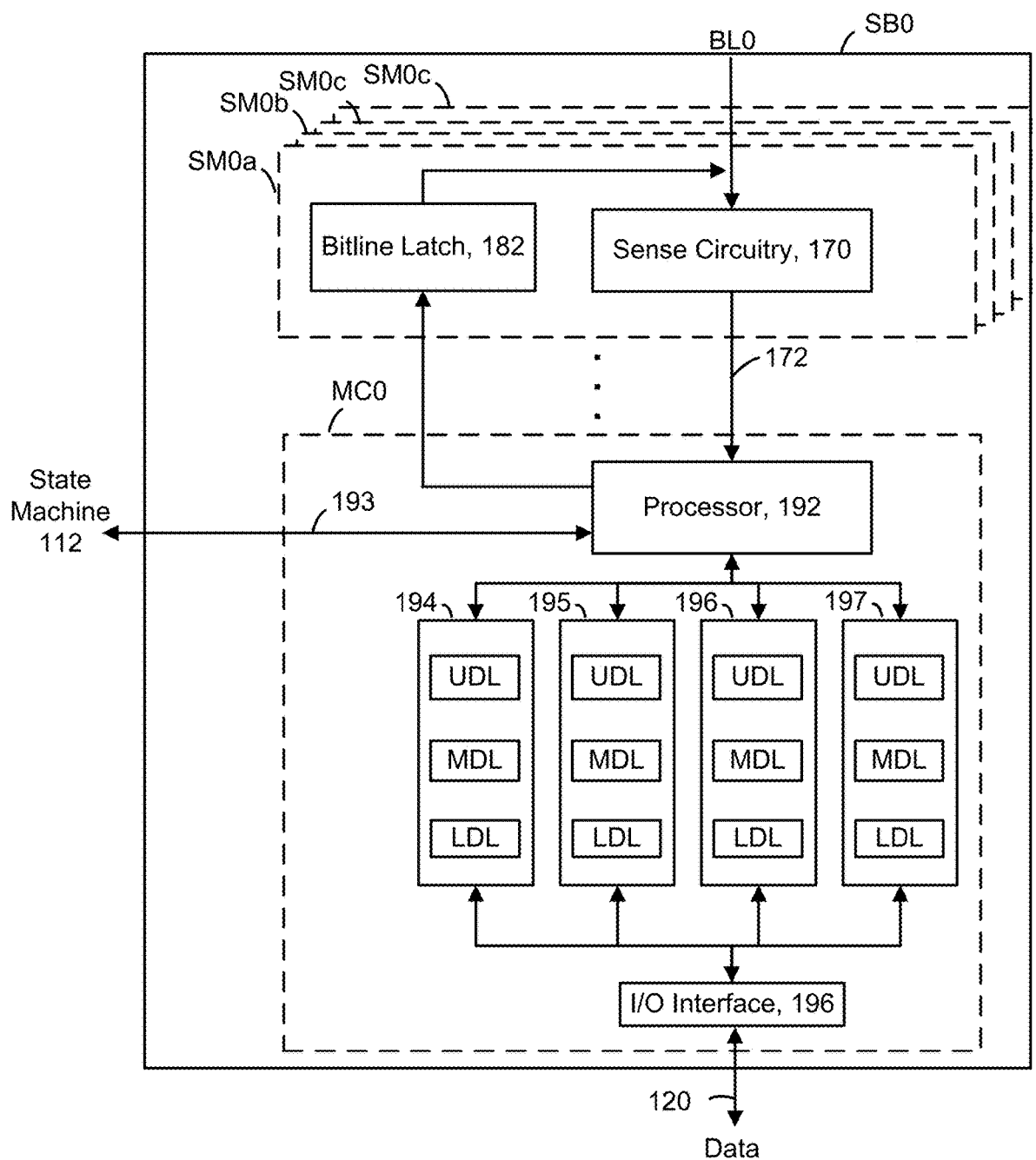
FIG. 2 is a block diagram depicting one embodiment of the sense block SB0 of FIG. 1.

FIG. 2 is a block diagram depicting one embodiment of the sense block SB0 of FIG. 1. SB0 is partitioned into one or more core portions, referred to as sense modules (e.g., SM0a-SM0d) or sense amplifiers, and a common portion, referred to as a managing circuit (MC0). In one embodiment, there is a separate sense module for each bit line and one common managing circuit for a set of multiple, e.g., four, sense modules SM0a-SM0d. Each of the sense modules in a group communicates with the associated managing circuit via a data bus 172. Thus, there are one or more managing circuits which communicate with the sense modules of a set of memory cells.

The sense module SM0a, for example, comprises sense circuitry 170 that performs sensing by determining whether a conduction current in a connected bit line is above or below a predetermined threshold level. SM0a includes a bit line latch 182 that is used to set a voltage condition on the connected bit line. For example, a predetermined state latched in bit line latch 182 will result in the connected bit line being pulled to a state designating program inhibit (e.g., 1.5-3 V). As an example, flag=0 can inhibit programming, while flag=1 allows programming.

Managing circuit MC0 comprises a processor 192, four example sets of data latches (DLs) 194-197 and an I/O Interface 196 coupled between the set of data latches 194 and data bus 120. One set of data latches can be provide for each sense module, and data latches identified by LDL, MDL and UDL may be provided for each set. LDL, MDL and UDL store a bit for a lower page (LP), middle page (MP) and upper page (UP) of write data, respectively, in a memory which stores three bits of data in each memory cell.

Processor 192 performs computations, such as to determine the data stored in the sensed memory cell and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of the state machine 112 that controls the supply of different control gate voltages to the addressed memory cell. As it steps through the various predefined control gate voltages corresponding to the various memory states supported by the memory, the sense module may trip at one of these voltages and a corresponding output will be provided from sense module to processor 192 via bus 172. At that point, processor 192 determines the resultant memory state by consideration of the tripping event(s) of the sense module and the information about the applied control gate voltage from the state machine via input lines 193. It then computes a binary encoding for the memory state and stores the resultant data bits into data latches 194-197. In another embodiment of the managing circuit MC0, bit line latch 182 serves both as a latch for latching the output of the sense module and also as a bit line latch as described above.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations, the data to be programmed (write data) is stored in the set of data latches 194-197 from the data bus 120, in the LP, MP and UP data latches. The program operation, under the control of the state machine, comprises a series of programming voltage pulses applied to the control gates of the addressed memory cells. Each program pulse is followed by a read back (verify) to determine if the memory cell has been programmed to the desired memory state. In some cases, processor 192 monitors the read back memory state relative to the desired memory state. When the two states agree, the processor 192 sets the bit line latch 182 to cause the bit line to be pulled to a state designating program inhibit. This inhibits the memory cell coupled to the bit line from further programming even if program pulses appear on its control gate. In other embodiments, the processor initially loads the bit line latch 182 and the sense circuitry sets it to an inhibit value during the verify process.

Each set of data latches 194-197 may be implemented as a stack of data latches for each sense module. In one embodiment, there are three data latches per sense module. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Figure 3:
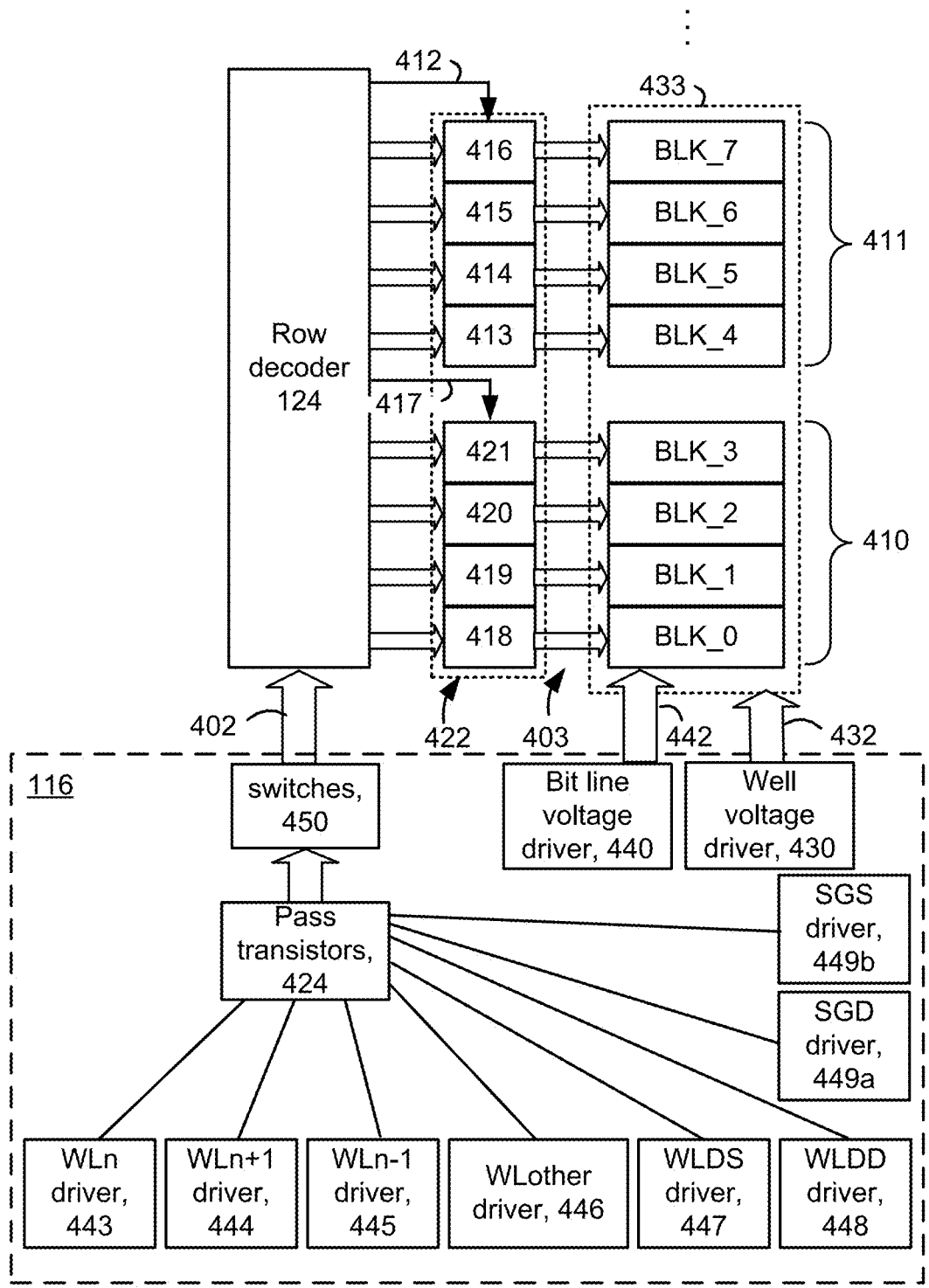
FIG. 3 depicts an example implementation of the power control module 116 of FIG. 1 for providing voltages to blocks of memory cells.

FIG. 3 depicts an example implementation of the power control module 116 of FIG. 1 for providing voltages to blocks of memory cells. In this example, the memory structure 126 includes a set 410 of four related blocks, BLK_0 to BLK_3, and another set 411 of four related blocks, BLK_4 to BLK_7. The blocks can be in one or more planes. The row decoder 124 of FIG. 1 provides voltages to word lines and select gates of each block via pass transistors 422. The row decoder provides a control signal to pass transistors which connect the blocks to the row decoder. In one approach, the pass transistors of each set of blocks are controlled by a common control gate voltage. Thus, the pass transistors for a set of block are either all on or off at a given time. If the pass transistors are on, a voltage from the row decoder is provided to the respective control gate lines or word lines. If the pass transistors are off, the row decoder is disconnected from the respective control gate lines or word lines so that the voltage floats on the respective control gate lines or word lines.

For instance, a control gate line 412 is connected to sets of pass transistors 413, 414, 415 and 416, which in turn are connected to control gate lines of BLK_4, BLK_5, BLK_6 and BLK_7, respectively. A control gate line 417 is connected to sets of pass transistors 418, 419, 420 and 421, which in turn are connected to control gate lines of BLK_0, BLK_1, BLK_2 and BLK_3, respectively.

Typically, program or read operations are performed on one selected block at a time and on one selected sub-block of the block. An erase operation may be performed on a selected block or sub-block. The row decoder can connect global control lines 402 to local control lines 403. The control lines represent conductive paths. Voltages are provided on the global control lines from a number of voltage drivers. Some of the voltage drivers may provide voltages to switches 450 which connect to the global control lines. Pass transistors 424 are controlled to pass voltages from the voltage drivers to the switches 450.

The voltage drivers can include a selected data word line driver (WLn driver 443), which provides a voltage on a data word line selected during a program or read operation, a WLn+1 driver 444 for a drain side adjacent word line (adjacent to and on a drain side of a selected word line WLn and/or after WLn in a word line programming order), a WLn−1 driver 445 for a source side adjacent word line (adjacent to and on a source side of WLn and/or before WLn in a word line programming order), a WLother driver 446 for other unselected data word lines, a WLDS driver 447 for source side dummy word lines and a WLDD driver 448 for drain side dummy word lines. The voltage drivers can also include an SGD driver 449a for the SGD transistors and a SGS driver 449b for the SGS transistors.

The various components, including the row decoder, may receive commands from a controller such as the state machine 112 or the controller 122 to perform the functions described herein.

A well voltage driver 430 provides a voltage Vsource to the well region 611a (see FIG. 5A) in the substrate, via control lines 432. In one approach, the well region 433 is common to the blocks. A set of bit lines 442 is also shared by the blocks. A bit line voltage driver 440 provides voltages to the bit lines. In a stacked memory device such as depicted in FIGS. 5A and 5B, sets of connected memory cells may be arranged in NAND strings which extend vertically upward from the substrate. The bottom (or source end) of each NAND string is in contact with the well region, and the top end (or drain end) of each NAND string is connected to a respective bit line, in one approach.

Figure 4:
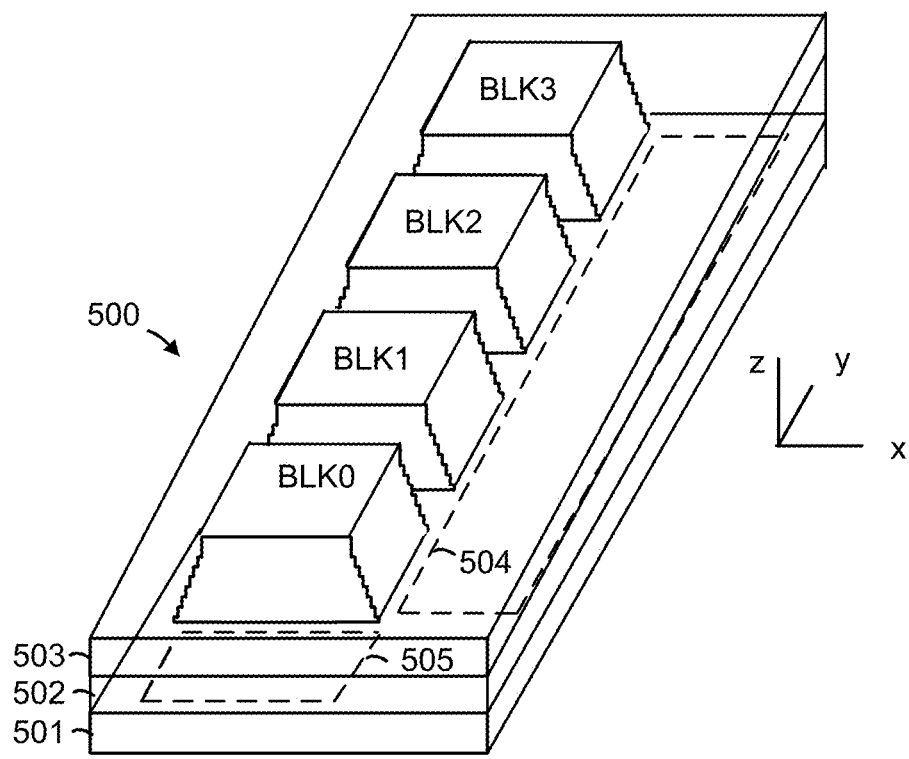
FIG. 4 is a perspective view of a memory device 500 comprising a set of blocks in an example 3D configuration of the memory structure 126 of FIG. 1.

FIG. 4 is a perspective view of a memory device 500 comprising a set of blocks in an example 3D configuration of the memory structure 126 of FIG. 1. On the substrate are example blocks BLK0, BLK1, BLK2 and BLK3 of memory cells (storage elements) and peripheral areas with circuitry for use by the blocks. The peripheral area 504 runs along an edge of each block while the peripheral area 505 is at an end of the set of blocks. The circuitry can include voltage drivers which can be connected to control gate layers, bit lines and source lines of the blocks. In one approach, control gate layers at a common height in the blocks are commonly driven. The substrate 501 can also carry circuitry under the blocks, and one or more lower metal layers which are patterned in conductive paths to carry signals of the circuitry. The blocks are formed in an intermediate region 502 of the memory device. In an upper region 503 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

FIG. 5A depicts an example cross-sectional view of a portion of the block BLK0 of FIG. 4. The block comprises a stack 610 of alternating conductive and dielectric layers. In this example, the conductive layers comprise two SGD layers, one SGS layer, two source side dummy word line layers (or word lines) WLDS1 and WLDS0, two drain side dummy word line layers WLDD1 and WLDD0, and ten data word line layers (or word lines) WL0-WL9. WL0 is a source side data word line and WLDS1 is a dummy word line layer which is adjacent to the source side data word line. WLDS0 is another dummy word line layer which is adjacent to WLDS1. WL9 is a drain side data word line and WLDD1 is a dummy word line layer which is adjacent to the drain side data word line. WLDD0 is another dummy word line layer which is adjacent to WLDD1. The dielectric layers are labelled as DL1-DL18. Further, regions of the stack which comprise NAND strings 700n and 710n are depicted. The NAND strings 700*n* and 710*n* are in different sub-blocks SB0 and SB1, consistent with FIG. 6A. The sub-blocks are divided by an insulation region 612. Each NAND string encompasses a memory hole 618 or 619 which is filled with materials which form memory cells adjacent to the word lines. Region 622 of the stack is shown in greater detail in FIG. 5B.

The stack includes a substrate 611. In one approach, a portion of the source line SL comprises a well region 611*a* as an n-type source diffusion layer or well in the substrate. The well region is in contact with a source end of each string of memory cells in a block. An erase pulse may be applied to this layer in an erase operation The n-type well region 611*a* is formed in a p-type well region 611*b*, which in turn is formed in an n-type well region 611*c*, which in turn is formed in a p-type semiconductor substrate 611*d*, in one possible implementation. The n-type source diffusion layer may be shared by all of the blocks in a plane, in one approach.

NAND string 700*n* has a source-end 613 at a bottom 616*b* of the stack 616 and a drain-end 615 at a top 616*a* of the stack. Metal-filled slits 617 and 620 may be provided periodically across the stack as interconnects which extend through the stack, such as to connect the source line to a line above the stack. The slits may be used during the formation of the word lines and subsequently filled with metal. A portion of a bit line BL0 is also depicted. A conductive via 621 connects the drain-end 615 to BL0.

In one approach, the block of memory cells comprises a stack of alternating control gate and dielectric layers, and the memory cells are arranged in vertically extending memory holes in the stack.

In one approach, each block comprises a terraced edge in which vertical interconnects connect to each layer, including the SGS, WL and SGD layers, and extend upward to horizontal paths to voltage drivers.

FIG. 5B depicts a close-up view of the region 622 of the stack of FIG. 5A. Memory cells are formed at the different levels of the stack at the intersection of a word line layer and a memory hole. In this example, memory cells 704-708 are connected to word lines WL0-WL4, respectively.

A number of layers can be deposited along the sidewall (SW) of the memory hole 630 and/or within each word line layer, e.g., using atomic layer deposition. For example, each pillar 685 or column which is formed by the materials within a memory hole can include a blocking oxide layer 663, a charge-trapping layer 664 or film such as silicon nitride ($Si_3N_4$) or other nitride, a tunneling layer 665 (e.g., comprising an oxide), a channel 660 (e.g., comprising polysilicon), and a dielectric core 666 (e.g., comprising silicon dioxide). A word line layer can include a metal barrier 661 and a conductive metal 661*a* such as Tungsten as a control gate. For example, control gates 690-694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

Each NAND string (or NAND chain or set of connected transistors) comprises a channel which extends continuously from one or more source-end select gate transistors to one or more drain-end select gate transistors. The channel 700*a* is continuous in that it is uninterrupted and can therefore provide a continuous conductive path in the NAND string.

When a memory cell is programmed, electrons are stored in a portion of the charge-trapping layer which is associated with the memory cell. These electrons are drawn or injected into the charge-trapping layer from the channel, and through the tunneling layer. The Vth of a memory cell is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

FIG. 6A depicts an example view of NAND strings in BLK0 which is consistent with FIGS. 4 and 5A, and an example word line programming order for a two-pass program operation. The NAND strings are arranged in sub-blocks of the block in a 3D configuration. Each sub-block includes multiple NAND strings, where one example NAND string is depicted. For example, SB0, SB1, SB2 and SB3 comprise example NAND strings 700*n*, 710*n*, 720*n* and 730*n*, respectively. The NAND strings have data word lines, dummy word lines and select gate lines consistent with FIG. 5A. Each sub-block comprises a set of NAND strings which extend in the x direction and which have a common SGD line or control gate layer. The NAND strings 700*n*, 710*n*, 720*n* and 730*n* are in sub-blocks SB0, SB1, SB2 and SB3, respectively. Programming of the block may occur based on a word line programming order. One option is to program the memory cells in different portions of a word line which are in the different sub-blocks, one sub-block at a time, before programming the memory cells of the next word line. Another option programs all of the memory cells in one sub-block, one word line portion at a time, before programming the memory cells of the next sub-block. The word line programming order may start at WL0, the source-end word line and end at WL9, the drain-end word line, for example.

In a multi-pass program operation comprising a first program pass and a second program pass, the word lines are selected for programming in an order which is depicted by the circled numbers at the left hand side 650 of the figure. For example, "1" indicates WL0 is programmed in a first program pass, "2" indicates WL1 is then programmed in a first program pass, "3" indicates WL0 is then programmed in a second program pass, "4" indicates WL2 is then programmed in a first program pass, "5" indicates WL1 is then programmed in a second program pass, and so forth. See also FIG. 7A-7C.

The NAND strings 700*n*, 710*n*, 720*n* and 730*n* have channels 700*a*, 710*a*, 720*a* and 730*a*, respectively.

Additionally, NAND string 700*n* includes SGS transistor 701, dummy memory cells 702 and 703, data memory cells 704-713, dummy memory cells 714 and 715, and SGD transistors 716 and 717. NAND string 710*n* includes SGS transistor 721, dummy memory cells 722 and 723, data memory cells 724-733, dummy memory cells 734 and 735, and SGD transistors 736 and 737. NAND string 720*n* includes SGS transistor 741, dummy memory cells 742 and 743, data memory cells 744-753, dummy memory cells 754 and 755, and SGD transistors 756 and 757. NAND string 730*n* includes SGS transistor 761, dummy memory cells 762 and 763, data memory cells 764-773, dummy memory cells 774 and 775, and SGD transistors 776 and 777.

One or more SGD transistors are provided at the drain-end of each NAND string, and one or more SGS transistors are provided at the source-end of each NAND string. The SGD transistors in SB0, SB1, SB2 and SB3 may be driven by separate control lines SGD0(0) and SGD1(0), SGD0(1) and SGD1(1), SGD0(2) and SGD1(2), and SGD0(3) and SGD1(3), respectively, in one approach. In another approach, all of the SGD transistors in a sub-block are connected and commonly driven. The SGS transistors in SB0, SB1, SB2 and SB3 may be driven by separate control lines SGS(0), SGS(1), SGS(2) and SGS(3), respectively. In another approach, all of the SGS transistors in a block are connected and commonly driven.

FIG. 6B depicts an example word line programming order for a three-pass program operation using BLK0 of FIG. 6A. In this program operation, each word line has a first, second and third program pass. A repeating pattern which applies to a majority of the word lines extends from WL2-WL7. For these word lines, three program passes are performed on other word lines between the first and second program pass, and between the second and third program pass. For example, first and second program passes are performed for WL2, as denoted by steps "4" and "8", respectively. Steps 5-7 refer to other program passes which are performed between these first and second program passes. Second and third program passes are performed for WL2, as denoted by steps "8" and "12", respectively. Steps 9-11 refer to other program passes which are performed between these first and second program passes. See also FIG. 8A-8D.

FIG. 7A to 7C depict an example of a two-pass program operation, where FIG. 7A depicts a starting Vth distribution, FIG. 7B depicts a Vth distribution after a first program pass and FIG. 7C depicts a Vth distribution after a second program pass. In these figures, the vertical axis depicts a number of memory cells and the horizontal axis depicts a voltage. This example uses two-pass programming and eight assigned data states. Other options are possible, including more than two passes and a different number of data states. Initially, all memory cells are in the Er state, represented by the Vth distribution 800 (FIG. 7A). A first program pass is based on a lower page (LP) of write data. If LP=1, memory cells in the Er state remain in that state. If LP=0, memory cells are programmed from the Er state to an intermediate (INT) state, represented by a Vth distribution 802, using a verify voltage VvINT. See FIG. 7B. The INT state may be between the erased state and the highest programmed state, e.g., the G state.

A second program pass is based on the UP and MP bits of data. If UP and MP are 1 and 1, respectively, memory cells in the Er state remain in that state and in the Vth distribution 800 in FIG. 7C, and memory cells in the INT state are programmed to the G state as represented by the Vth distribution 816. If UP and MP are 0 and 1, respectively, memory cells in the Er state are programmed to the A state as represented by the Vth distribution 810, and memory cells in the INT state are programmed to the F state as represented by the Vth distribution 815. If UP and MP are 0 and 0, respectively, memory cells in the Er state are programmed to the B state as represented by the Vth distribution 811, and memory cells in the INT state are programmed to the E state as represented by the Vth distribution 814. If UP and MP are 1 and 0, respectively, memory cells in the Er state are programmed to the C state as represented by the Vth distribution 812, and memory cells in the INT state are programmed to the D state as represented by the Vth distribution 813. Each data state is represented by a three bit sequence. For example, data states Er, A, B, C, D, E, F and G are represented by: 111, 011, 001, 101, 100, 000, 010 and 110. In each sequence, the UP bit is followed by the MP and LP bits.

The memory cells are programmed to the A, B, C, D, E, F and G states using verify voltages of VvA, VvB, VvC, VvD, VvE, VvF and VvG, respectively. Read voltage VvA, VvB, VvC, VvD, VvE, VvF and VvG are also depicted.

The Vth distributions are widened at the upper tail for the Er, A and B states as depicted by the Vth distributions 800a, 810a and 811a, respectively. The widening can be caused by neighbor word line interference and program disturb, as mentioned, and is seen mainly on the memory cells of the lower data states. The program techniques described herein can reduce the widening of the Vth distributions.

Figure 8A:
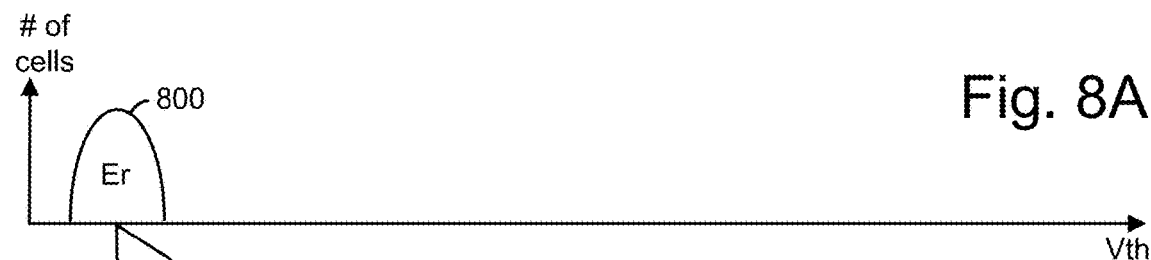
FIG. 8A to 8D depict an example of a three-pass program operation, where
Figure 8B:
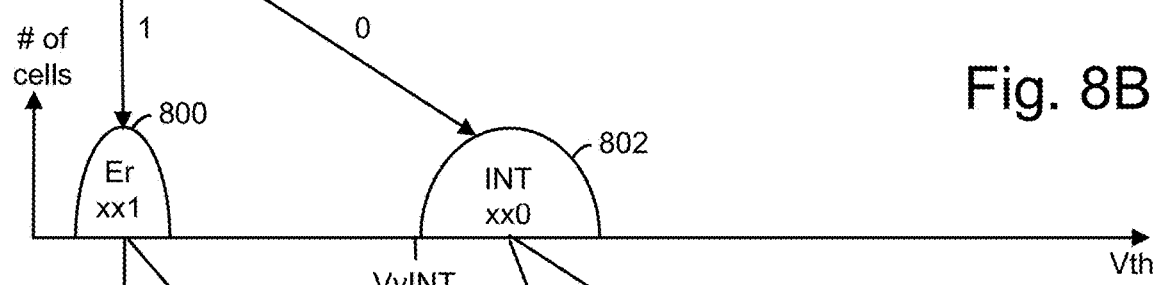
Figure 8C:
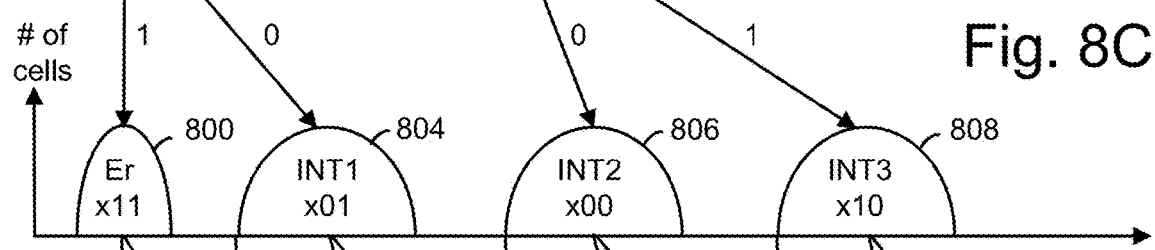
Figure 8D:
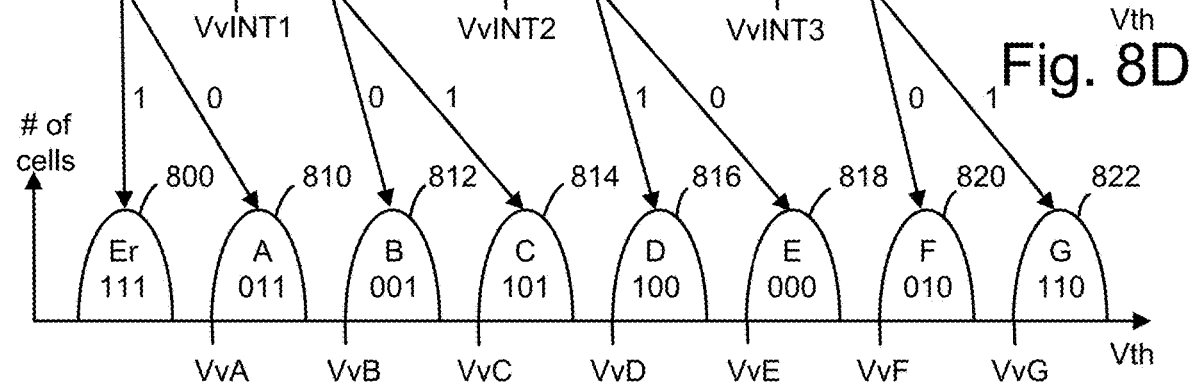

FIG. 8A to 8D depict an example of a three-pass program operation, where FIG. 8A depicts a starting Vth distribution, FIG. 8B depicts a Vth distribution after a first program pass, FIG. 8C depicts a Vth distribution after a second program pass, and FIG. 8D depicts a Vth distribution after a third program pass, consistent with FIG. 6B.

FIG. 8A depicts a starting threshold distribution of the three-pass programming operation. Initially, the cells are all in the erased (Er) state as represented by the threshold distribution (Vth) distribution 800. The vertical axis indicates the number of cells and the horizontal axis indicates a Vth.

FIG. 8B depicts a threshold distribution which results after a first program pass of the example three-pass programming operation of FIG. 8A. Based on write data as indicated, the cells which are to remain in the Er state, or programmed to the A, B and C states, are represented by the Vth distribution 800, while the cells which are to be programmed to the D, E, F and G states are programmed to an intermediate (INT) distribution 802. This programming pass may be referred to as a first intermediate pass in which a verify level of VvINT is used.

FIG. 8C depicts a threshold distribution which results after a second program pass of the example three-pass programming operation of FIG. 8A. Based on write data as indicated, the cells which are to remain in the Er state, or programmed to the A state, are represented by the Vth distribution 800. The cells which are to be programmed to the B and C states are programmed to a first intermediate (INT1) distribution 804. The cells which are to be programmed to the D and E states are programmed to a second intermediate (INT2) distribution 806. The cells which are to be programmed to the F and G states are programmed to a third intermediate (INT3) distribution 808. This programming pass may be referred to as a second intermediate pass in which verify levels of VvINT1, VvINT2 and VvINT3 are used.

FIG. 8D depicts a threshold distribution which results after a third pass of the example three-pass programming operation of FIG. 8A. Based on the write data as indicated, the cells which are to remain in the Er state are represented by the Vth distribution 800, while the cells which are to be programmed to the A, B, C, D, E, F and G states are represented by the Vth distributions 810, 812, 814, 816, 818, 820 and 822, respectively. This programming pass uses verify levels of VvA-VvG.

The widening of the Vth distributions is not depicted but would be similar to what is shown in FIG. 7C. The amount of widening may be reduced compared to the two-pass program operation since the Vth is increased more gradually with less overshoot above the verify voltage. However, there is a time penalty as the number of program passes increases.

Generally, a multi-pass program operation with a back and forth word line programming order (such as depicted in FIGS. 6A and 6B) can reduce the amount of neighbor word line interference because the transition in Vth of a word line which can disturb an adjacent word line is reduced, compared to a single pass program operation. For example, in the final program pass of FIG. 7C, the transition of the memory cells in the Er Vth distribution 800 is no more than three data states. In contrast, in a single pass program operation, the maximum transition is seven data states—from the Er state to the G state. Another advantage of a multi-pass program operation with a back and forth word line programming is that short term data retention is improved.

FIG. 9A depicts an example of a voltage signal used in the first program pass of FIG. 7B. In FIG. 9A-9C, the horizontal axis denotes a program loop (PL) number, and the vertical axis denotes voltage. This voltage signal uses a fixed amplitude program pulse in each program loop. This approach could result in a narrower Vth distribution for the INT state, compared to the approach of FIG. 9B, because the programming is more gradual. The first program pass is similar to the second program pass of FIG. 9C except typically a larger initial program voltage, Vpgm_init1 (>Vpgm_int2), is used, and the operation may be completed in fewer program loops. The voltage signal 900 includes a series of program voltages, including an initial program voltage 901, which are applied to a word line which is selected for programming. The verify voltage in each program loop, including example verify voltage 902, has a level of VvINT. After the program pass is completed, a Vth distribution similar to that in FIG. 7B is achieved.

FIG. 9B depicts another example of a voltage signal used in the first program pass of FIG. 7B. The amplitude of the program pulse is increased in each program loop. This approach could result in a faster completion of the first program pass, compared to the approach of FIG. 8A. For example, seven program loops are used instead of eight. The voltage signal 910 includes a series of program voltages, including an initial program voltage 911. The verify voltage in each program loop, including example verify voltage 912, has a level of VvINT.

FIG. 9C depicts an example of a voltage signal used in the second program pass of FIG. 7C. During a program pass, program loops are performed for a selected word line. A program loop comprises a program portion in which a program voltage or pulse is applied to the selected word line followed by a verify portion in which a verify voltage is applied to the selected word line while one or more verify tests are performed for the associated memory cells. A conductive level of the memory cells is sensed by the sense circuit during each verify test. When the Vth of a memory cell is increased to the point that the memory cell judged to be in a non-conductive state, the memory cell passes the verify tests and is locked out from further programming in the program pass. When the conductive level exceeds a reference level in the sense circuit, the memory cell is in a conductive state. When the conductive level does not exceed the reference level, the memory cell is in a non-conductive state.

Other than the erased state, each assigned data state has a verify voltage which is used in the verify test for the state in a program operation. The voltage signal 920 includes a series of program voltages, including an initial program voltage 921, which are applied to a word line selected for programming. In this example, the voltage signal includes program voltages which increase stepwise in amplitude in program loops of a program pass using a fixed or varying step size. This is referred to as incremental step pulse programming, where the program voltage starts at an initial level Vpgm_int2 and increases in a step in each successive program loop, for instance, until the program pass is completed. A successful completion occurs when the threshold voltages of the selected memory cells reach the verify voltages of the assigned data states.

Figure 12A:
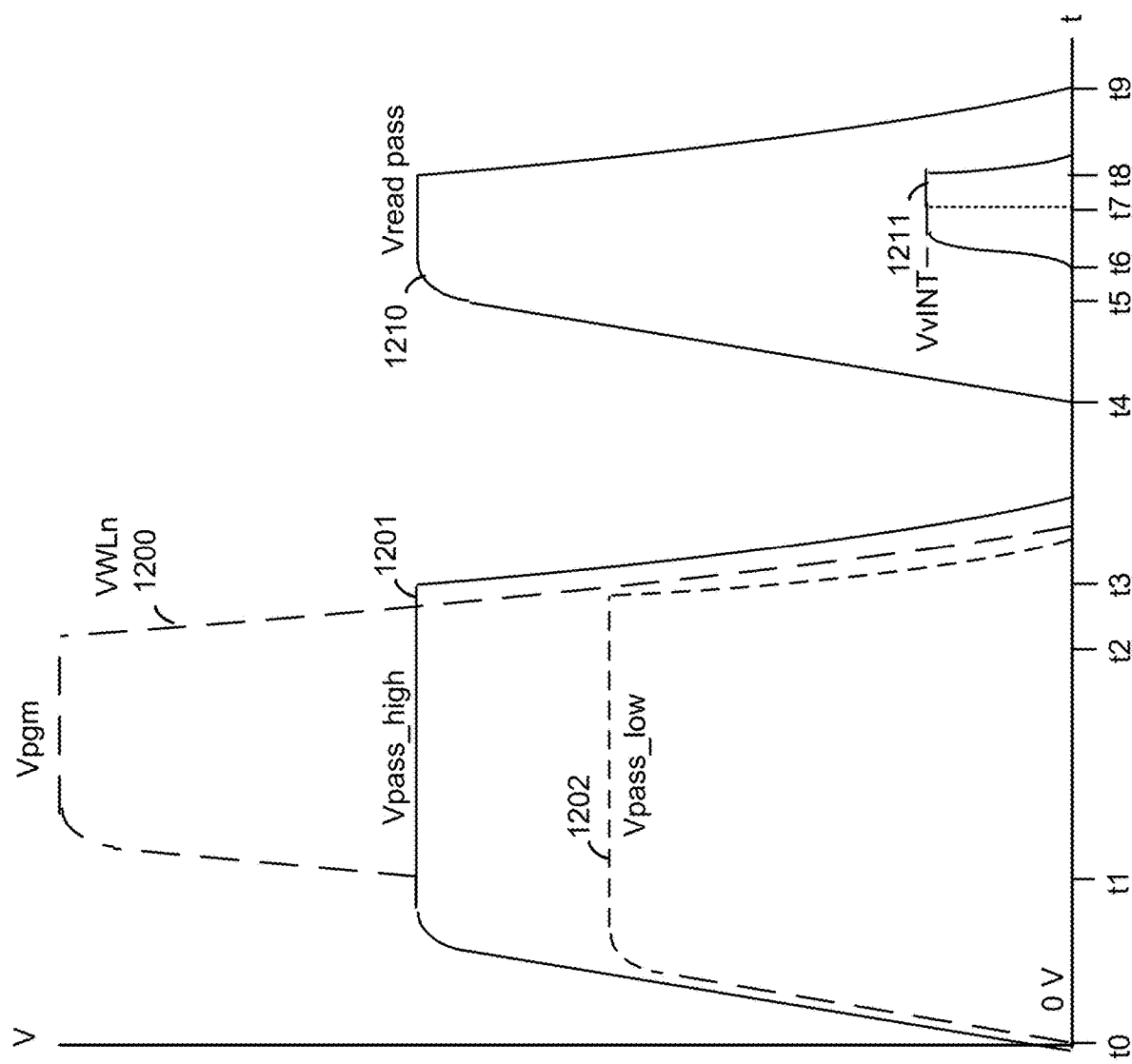
FIG. 12A depicts example waveforms in a program loop of a first or other pre-final program pass, consistent with step 1100 of the program process of FIG. 11A.
Figure 12B:
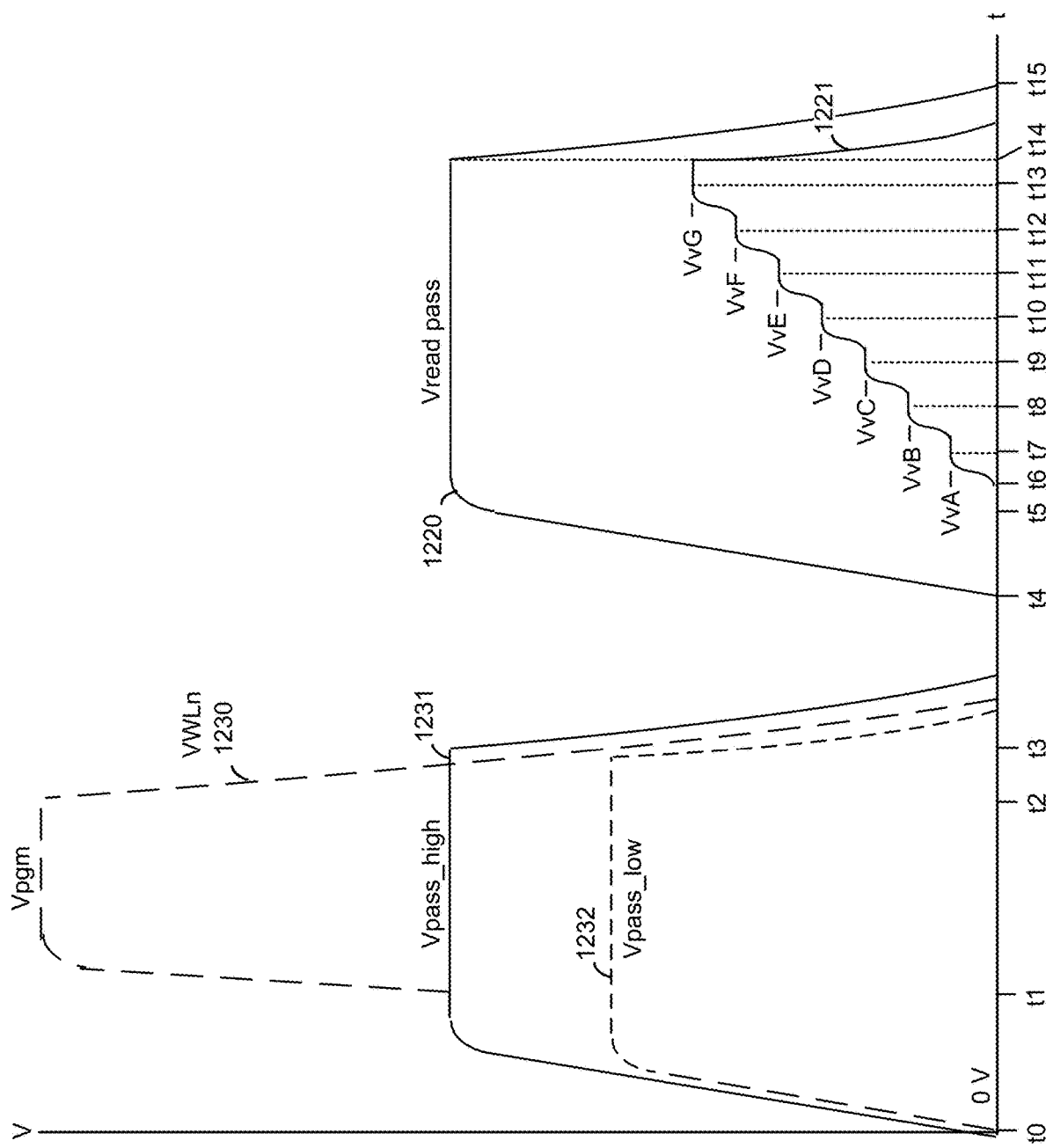
FIG. 12B depicts example waveforms in a program loop of a second or other final program pass, consistent with step 1103 of the program process of FIG. 11A.

The verify signal in each program loop, including example verify signal 922, can include a number of verify voltages such as depicted in FIG. 12B.

All memory cells may initially be in the erased state at the beginning of a program operation, for instance. After the program operation is completed, a Vth distribution similar to that in FIG. 7C is achieved, and the data can be read from the memory cells using read voltages which are between the Vth distributions. At the same time, a read pass voltage (e.g., 8-10 V), is applied to the remaining, unselected word lines. By testing whether the Vth of a given memory cell is above or below one or more of the read reference voltages, the system can determine the data state which is represented by a memory cell. These voltages are demarcation voltages because they demarcate between Vth ranges of different data states.

Moreover, the data which is programmed or read can be arranged in pages. For example, with four data states, or two bits per cell, two pages of data can be stored. An example encoding of bits for the Er, A, B and C states is 11, 10, 00 and 01, respectively, in the format of upper page (UP) bit/lower page (LP) bit. A lower page read may use VrA and VrC and an upper page read may use VrB.

With eight data states, or three bits per cell, three pages of data can be stored. An example encoding of bits for the A, B, C, D, E, F and G states is provided in FIG. 7C. The data of the lower page can be determined by reading the memory cells using VrD, the data of the middle page can be determined by reading the memory cells using VrB and VrF, and the data of the upper page can be determined by reading the memory cells using VrA, VrC, VrE and VrG. See also FIG. 12C.

FIG. 10A depicts the portion 699 of a stack of FIG. 5B, in a first program pass using asymmetric boosting with a high source side pass voltage and a low drain side pass voltage. A high or low pass voltage refers to a relatively high or low, respectively, pass voltage, relative to all of the pass voltages used in a program operation. The portion of the stack includes WL1 (e.g., WLn) as an example selected or subject word line, WL0 (e.g., WLn−1) as the adjacent source side word line and WL2 (e.g., WLn+1) as the adjacent drain side word line. The charge trapping layer 664 includes portions 664d, 664a, 664b and 664c which are adjacent to WL0, DL5, WL1 and DL6, respectively. Recall from the example of FIG. 7B, for instance, that some memory cells of WL1 will remain in the erased state in the first program pass and not be programmed. Instead, their respective NAND strings will be inhibited from programming. Their SGD transistors are provided in a non-conductive state so that when the pass voltages are applied, the channel will be boosted and programming will be prevented. Other memory cells of WL1 will be programmed to the INT state in the first program pass. Their SGD transistors are provided in a conductive state so that when the pass voltages are applied, the channel will not be significantly boosted and programming can occur. The example of FIG. 10A involves a NAND string in which programming occurs for the memory cell of WL1 since this is the scenario which results in parasitic electrons and potential Vth widening.

To program the memory cell of WL1, a program voltage Vpgm is applied to WL1, Vpass_high is applied to WL0 and Vpass_low is applied to WL2, in this example. Referring also to FIG. 6A, the memory cells 704-706 can be connected to WL0-WL2, respectively. Thus, the memory cell 705 is programmed in a first program pass in this example. The memory cell 704 is a source side memory cell adjacent to the selected memory cell 705, and the memory cell 706 is a drain side memory cell adjacent to the selected memory cell 705.

The program voltage creates a direct gate-to-channel electric field represented by an arrow 1003. In a selected NAND string, this field draws in electrons (such as an example electron 1030) from the channel to the portion 664b of the charge-trapping layer. The electrons are represented by a circle around a minus sign. Additionally, the program voltage creates source and drain side fringing gate-to-channel electric fields represented by arrow 1002 and 1004, respectively. The relative widths of the arrows represent the relative magnitudes of the electric fields. The fringing electric fields are weaker than the direct electric fields. The amount of electron injection is also a function of a coupling ratio between the control gate and the channel. An example coupling ratio is 0.8.

When Vpass_high is applied to WL0, a direct gate-to-channel electric field is created represented by an arrow 1000. The purpose of the pass voltages is to boost the voltage of the channels of the unselected NAND string to prevent program disturb. Additionally, the pass voltage creates a drain side fringing gate-to-channel electric field represented by an arrow 1001, and a source side fringing gate-to-channel electric field which is not shown.

The fringing electric field represented by the arrows 1001 and 1002 draw in electrons (such as example electrons 1010-1013) from the channel to the portion 664a of the charge-trapping layer, which is between WLn and WLn−1. These electrons may be referred to as parasitic electrons. As mentioned, it is desirable to encourage electron injection into this portion of the charge-trapping layer in the first program pass. By applying Vpass_high to WL0, the fringing field represented by the arrow 1001 is maximized so that the electron injection into this portion 664a of the charge-trapping layer is maximized. By maximizing the number of electrons which are drawn into this portion of the charge-trapping layer in the first or other pre-final program pass, the number of electrons which are drawn into this portion of the charge-trapping layer in the second or other final program pass is minimized. In the second program pass, it is harder to draw electrons into this portion of the charge-trapping layer when there is already a relatively large number of electrons already present. See also FIG. 16B.

The parasitic electrons in the portion 664a increase the apparent Vth of a memory cell connected to WL0. However, in a multi-pass program operation with a back and forth word line order, the memory cell of WL0 is programmed in a subsequent program pass which includes a verify test. The verify test for the memory cell of WL0 senses a Vth which is based on the parasitic electrons between WL0 and WL1 and electrons injected directly into the portion 664d of the charge-trapping layer which is at the height of WL0. Accordingly, the Vth distribution which results from the verify test is not widened by the presence of the parasitic electrons. In comparison, if a single-pass program operation was used, the parasitic electrons in the portion 664a would increase the apparent Vth of a memory cell connected to WL0 after the memory cell has completed programming. This would widen the Vth distribution of the set of memory cells connected to WL0. Additionally, the number of parasitic electrons in the portion 664a would be greater in the single-pass operation.

It is also possible for a fringing electric field to draw in electrons into a portion of the charge-trapping layer of an adjacent word line. For example, a fringing electric field could extend from WL1 to WL0 to draw in electrons into the portion 664d of the charge-trapping layer.

When Vpass_low is applied to WL2, a direct gate-to-channel electric field is created represented by an arrow 1006. Additionally, the pass voltage creates a source side fringing gate-to-channel electric field represented by an arrow 1005, and a drain side fringing gate-to-channel electric field which is not shown.

The fringing electric field represented by the arrows 1004 and 1005 draw in electrons (such as example electron 1040) from the channel to the portion 664c of the charge-trapping layer, which is between WLn and WLn+1. By applying Vpass_low to WL2, the fringing field represented by the arrow 1005 is minimized so that the electron injection into this portion of the charge-trapping layer is minimized.

FIG. 10B depicts the portion 699 of a stack of FIG. 10A, in a second program pass using asymmetric boosting with a low source side pass voltage and a high drain side pass voltage. When the program voltage Vpgm is applied to WL1, Vpass_low is applied to WL0 and Vpass_high is applied to WL2. The program voltage creates a direct gate-to-channel electric field represented by an arrow 1017. In a selected NAND string, this field draws in additional electrons (such as an example electron 1031) from the channel to the portion 664b of the charge-trapping layer. The electrons which were injected in the first program pass of FIG. 10A are repeated while the additional electrons which were injected in the second pass of FIG. 10B are represented by circles with a diagonal line pattern.

The program voltage also creates a source side fringing electric field represented by an arrow 1018, and a drain side fringing electric field represented by an arrow 1022.

When Vpass_low is applied to WL0, a direct gate-to-channel electric field is created represented by an arrow 1019, in addition to a drain side fringing gate-to-channel electric field represented by an arrow 1021, and a source side fringing gate-to-channel electric field which is not shown.

The fringing electric field represented by the arrows 1018 and 1021 draw in electrons (such as example electrons 1014-1016) from the channel to the portion 664a of the charge-trapping layer. As mentioned, it is desirable to discourage electron injection into this portion of the charge-trapping layer in the second or other final program pass. By applying Vpass_low to WL0, the fringing field represented by the arrow 1021 is minimized so that the electron injection into this portion of the charge-trapping layer is minimized in the second program pass. By minimizing the number of electrons which are drawn into this portion of the charge-trapping layer in the second or other final program pass, the amount of neighbor word line interference caused in the victim word line WLn−1 by the attacker word line WLn is minimized.

This is a result of the back and forth, multi-pass word line program order. For example, refer to FIG. 6A and the steps 1-5. After the memory cells of WL0 are programmed in a first program pass (step 1), the electron injection between WL0 and WL1 is maximized when WL1 is programmed in a first program pass (step 2). However, the accuracy of the first program pass is not as important as in the second program pass, so that some Vth widening of the memory cells of WL0 after the first program pass is acceptable. Recall that the widening occurs mainly on the lower data states.

The memory cells of WL0 are later programmed in a final program pass (step 3), where accuracy is most important. After the final program pass, Vth widening of the memory cells of WL0 should be minimized, where this subsequent widening is caused by programming of the memory cells of WL1 in the final program pass (step 5). A first program pass also occurs for WL2 (step 4) between steps 3 and 5 but this does not significantly affect the number of electrons in the portion of the charge-trapping layer between WL0 and WL1.

When Vpass_high is applied to WL2, a direct gate-to-channel electric field is created as represented by an arrow 1023. Additionally, the pass voltage creates a source side fringing gate-to-channel electric field represented by an arrow 1024, and a drain side fringing gate-to-channel electric field which is not shown.

The fringing electric field represented by the arrows 1022 and 1024 draw in electrons (such as example electron 1041) from the channel to the portion 664c of the charge-trapping layer. Applying Vpass_high to WL2 compensates for the fact that Vpass_low is applied to WL0 and minimizes an increase in the total number of program loops used to complete the final program pass. Even if a relatively large number of electrons are injected in the portion 664c of the charge-trapping layer, this will not increase widening of the Vth distribution of the memory cells of WL2 because the memory cells of WL2 have not had the final program pass at the time of the final program pass for WL1. For example, in FIG. 6A, step 7 has not yet occurred when step 5 occurs.

Figure 11A:
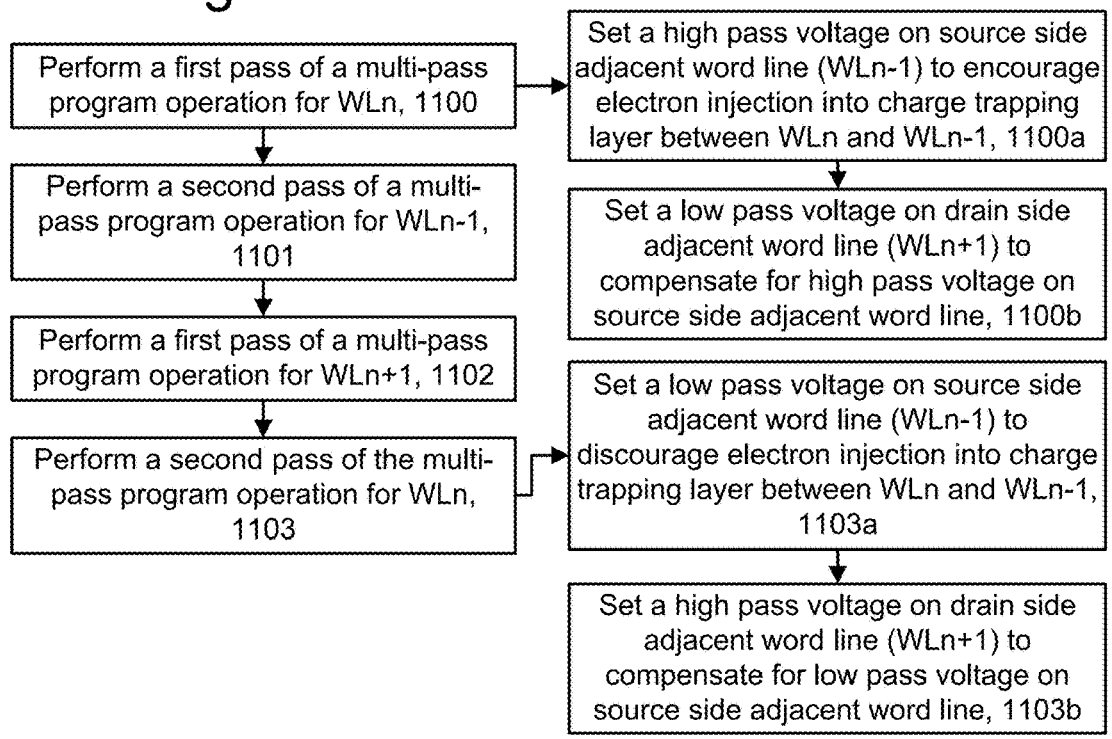
FIG. 11A depicts an example process for performing a multi-pass program operation, consistent with FIGS. 10A and 10B.

FIG. 11A depicts an example process for performing a multi-pass program operation, consistent with FIGS. 10A and 10B. The process depicted involves a portion of the programming of a block. For example, the process can involve steps 2-5 in FIG. 6A, where WL1 is the selected word line WLn, WL2 is WLn+1 and WL0 is WLn−1. In this case, steps 1100-1103 of FIG. 11A involve steps 2-5, respectively, in FIG. 6A.

Step 1100 includes performing a first program pass of a multi-pass program operation for a selected word line referred to as WLn. To implement this step, step 1100a can be performed which includes setting a high pass voltage (Vpass_high) on the source side adjacent word line (WLn−1) to encourage electron injection into the charge-trapping layer between WLn and WLn−1. Additionally, step 1100b can be performed, which includes setting a low pass voltage (Vpass_low) on the drain side adjacent word line (WLn+1) to compensate for the high pass voltage on the source side adjacent word line. See also FIG. 10A.

Step 1101 includes performing a second pass of a multi-pass program operation for WLn−1. Step 1102 includes performing a first program pass of a multi-pass program operation for WLn+1. Step 1103 includes performing a second program pass of the multi-pass program operation for WLn. To implement this step, step 1103a can be performed which includes setting a low pass voltage on the source side adjacent word line (WLn−1) to discourage electron injection into the charge-trapping layer between WLn and WLn−1. Additionally, step 1103b can be performed, which includes setting a high pass voltage on the drain side adjacent word line (WLn+1) to compensate for the low pass voltage on the source side adjacent word line. See also FIG. 10B.

A related apparatus may include a set of memory cells 704-713 arranged in a NAND string 700n and connected to a plurality of word lines WL0-WL9, the NAND string extends vertically in a stack comprising alternating conductive and dielectric layers, and a control circuit. The control circuit is configured to program a selected memory cell 705 of the set of memory cells in a pre-final program pass, subsequently program a source side memory cell 704 adjacent to the selected memory cell in a final program pass, and subsequently program the selected memory cell in a final program pass. In the pre-final program pass of the selected memory cell, the control circuit is configured to apply a first pass voltage (e.g., Vpass_high) to the source side memory cell while applying a program voltage (Vpgm) to the selected memory cell. In the final program pass of the selected memory cell, the control circuit is configured to apply a second pass voltage (e.g., Vpass_low) to the source side memory cell while applying a program voltage to the selected memory cell. The second pass voltage is lower than the first pass voltage when the selected memory cell is in a bottom portion of the stack.

In the pre-final program pass of the selected memory cell, the control circuit is configured to apply a third pass voltage (e.g., Vpass_low) to a drain side memory cell 706 adjacent to the selected memory cell 705 while applying the program voltage to the selected memory cell. In the final program pass of the selected memory cell, the control circuit is configured to apply a fourth pass voltage (e.g., Vpass_high) to the drain side memory cell while applying the program voltage to the selected memory cell. The fourth pass voltage is higher than the third pass voltage when the selected memory cell is in the bottom portion of the stack.

A related method comprises: programming a set of memory cells connected to a selected word line (WLn, WL1) in a first program pass, the programming in the first program pass comprises applying a program voltage (Vpgm) to the selected word line while applying a source side pass voltage (e.g., Vpass_high) to a source side word line (WLn−1, WL0) which is adjacent to the selected word line and while applying a drain side pass voltage (e.g., Vpass_low) to a drain side word line (WLn+1, WL2) which is adjacent to the selected word line; programming the set of memory cells in a second program pass which is after the first program pass, the programming in the second program pass comprises applying a program voltage to the selected word line while applying a source side pass voltage (e.g., Vpass_low) to the source side word line and while applying a drain side pass voltage (e.g., Vpass_high) to the drain side word line; and programming memory cells connected to the source side word lines before the first program pass and between the first program pass and the second program pass, wherein the source side pass voltage is lower in the second program pass than in the first program pass (e.g., Vpass_low is lower than Vpass_high).

Figure 11B:
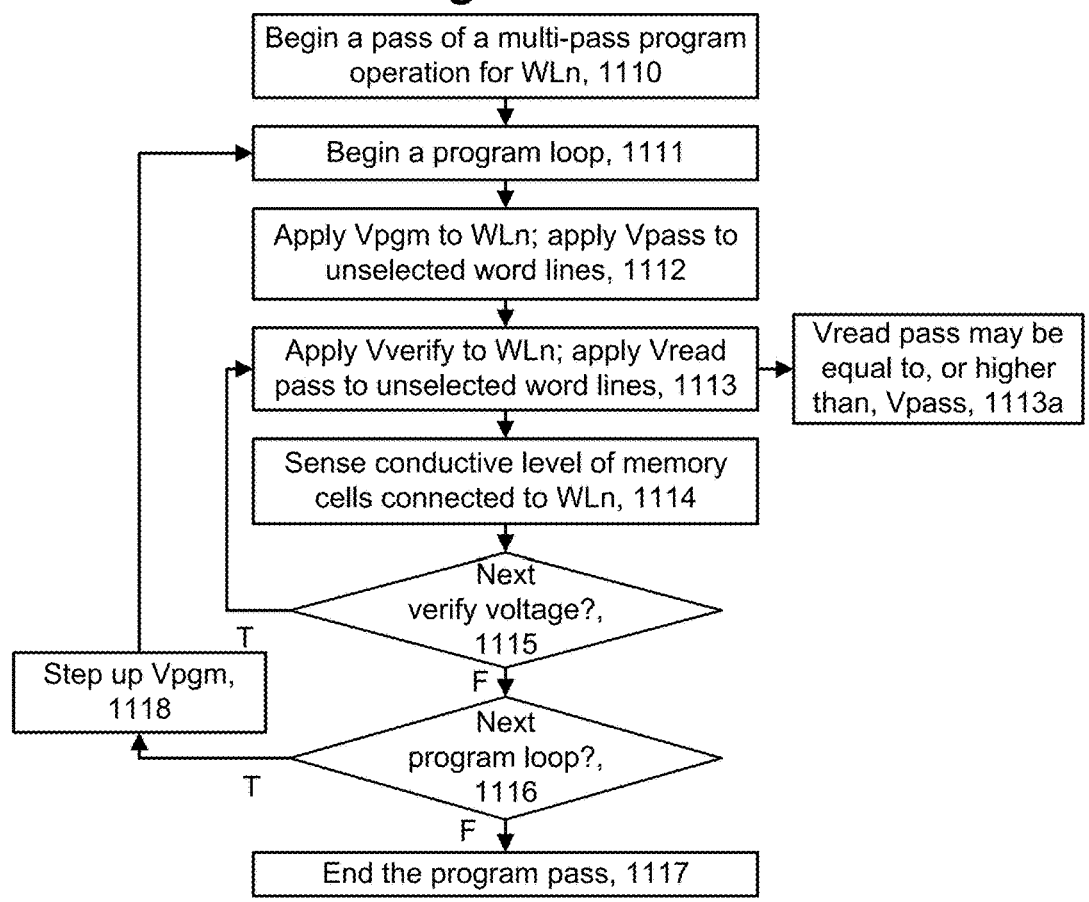
FIG. 11B depicts an example process for performing a program pass of the multi-pass program operation of FIG. 11A.

FIG. 11B depicts an example process for performing a program pass of the multi-pass program operation of FIG. 11A. Step 1110 begins a program pass of a multi-pass program operation for a word line WLn. Step 1111 begins a program loop in the pass. Step 1112 includes applying the program voltage Vpgm to WLn while concurrently applying a pass voltage (Vpass) to the unselected word lines. Step 1113 includes applying a verify voltage, Vverify, to WLn while concurrently applying a read pass voltage, Vread pass, to the unselected word lines. In one approach, a common Vread pass is applied to all of the unselected data word lines. In another approach, WLn−1 and WLn+1 receive a higher Vread pass than the remaining unselected word lines. This is done to ensure that the associated memory cells are strongly conductive during sensing of the WLn memory cells. Moreover, as depicted by step 1113a, Vread pass may be equal to or higher than Vpass.

Step 1114 includes sensing the conductive level of the memory cells connected to WLn. Steps 1113 and 1114 may be concurrent. A decision step 1115 determines if there is a next verify voltage in the program loop. If the decision step 1115 is true, step 1113 is repeated with the next verify voltage. If the decision step 1115 is false, a decision step 1116 is reached. The decision step 1116 determines whether there is a next program loop in the program pass. If the decision step 1116 is true, step 1118 involves optionally stepping up Vpgm and step 1111 is repeated in a next program loop. Typically, the program pass is completed when all, or nearly all, of the memory cells have passed their respective verify tests and reached the lockout condition. If the decision step 1116 is false, the program pass ends at step 1117.

Figure 11C:
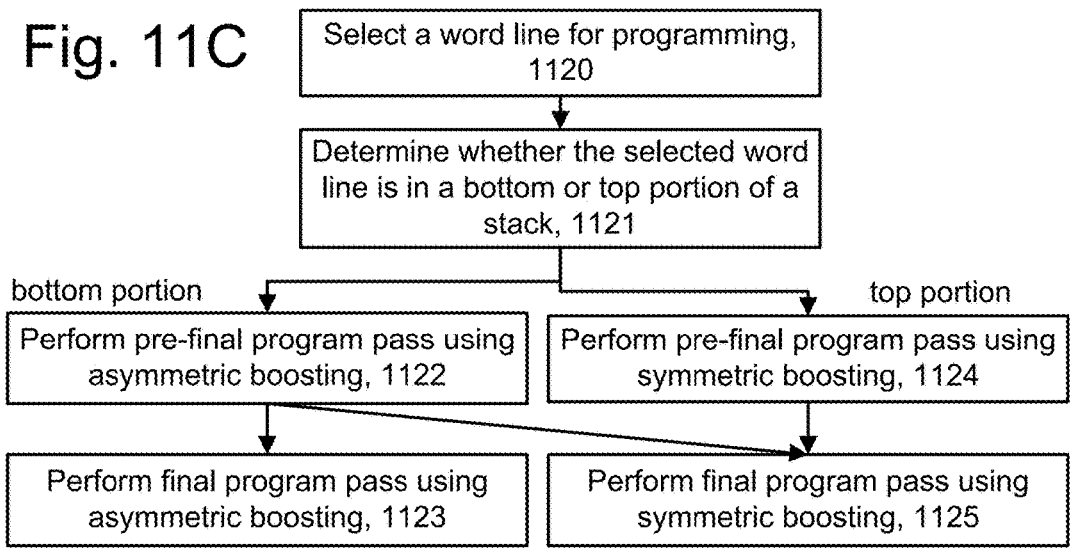
FIG. 11C depicts an example process for performing a multi-pass program operation using asymmetric or symmetric boosting, depending on a position of the selected word line in a stack.

FIG. 11C depicts an example process for performing a multi-pass program operation using asymmetric or symmetric boosting, depending on a position of the selected word line in a stack. See also FIG. 15A. Step 1120 includes selecting a word line WLn for programming. Step 1121 includes determining whether the selected word line is in a bottom or top portion of a stack. If WLn is in the bottom portion, step 1122 includes performing a pre-final program pass using asymmetric boosting and, subsequently, step 1123 includes performing a final program pass using asymmetric boosting or step 1125 includes performing a final program pass using symmetric boosting. If WLn is in the top portion, step 1124 includes performing a pre-final program pass using symmetric boosting and, subsequently, step 1125 is reached.

In symmetric boosting, the pass voltages are the same, or within a small range such as +/−10% of one another, for the adjacent word lines of the selected word line during the program pulse. In asymmetric boosting, the pass voltages more than a specified amount different from one another, such as more than 10% different from one another, for the adjacent word lines of the selected word line during the program pulse.

In the stack 610 of FIG. 5A, for example, the word lines extend from a bottom of the stack to a top of the stack. In this example, WL5 is at the midpoint of the stack. A bottom portion of the stack can include the word lines at or below the midpoint, and a top portion of the stack can include the word lines at or above the midpoint. For example, the bottom portion of the stack can include the word lines WL0-WL5 and the top portion of the stack can include the word lines WL6-WL9. As mentioned at the outset, boosting of the channel of a NAND string is more difficult when the selected word line is relatively high in the stack, and there are relatively many programmed memory cells below the selected word line. In this case, the boosting technique can be adjusted based on the position of the selected word line in the stack.

In one approach, a low source side pass voltage, Vpass_low, such as discussed in connection with FIG. 11A, step 1103a, may be used in the second or other final program pass when the selected word line is in the bottom portion of the stack and the boosting is relatively easy. A low pass voltage reduces the fringing electric field on the drain side of the selected word line, WLn, to reduce the amount of electron injection between WLn and WLn−1 and thus reduce widening of the Vth upper tail of the memory cells connected to WLn−1. However, a low pass voltage also reduces channel boosting, since the channel boosting is a function of the magnitude of the increase of the voltage of the unselected word lines. Accordingly, Vpass_high may be used in place of Vpass_low for the source side pass voltage in the final program pass when the selected word line is in the top portion of the stack and the boosting is relatively difficult.

In particular, in step 1122, asymmetric boosting may be used in the first or other pre-final program pass, where the source side pass voltage is higher than the drain side pass voltage, when the selected word line is in the bottom portion of the stack. Subsequently, asymmetric or symmetric boosting may be used in the final program pass. Asymmetric boosting may be used where the drain side pass voltage is higher than the source side pass voltage, e.g., by more than 10-25%, when the selected word line is in the bottom portion of the stack.

Figure 11D:
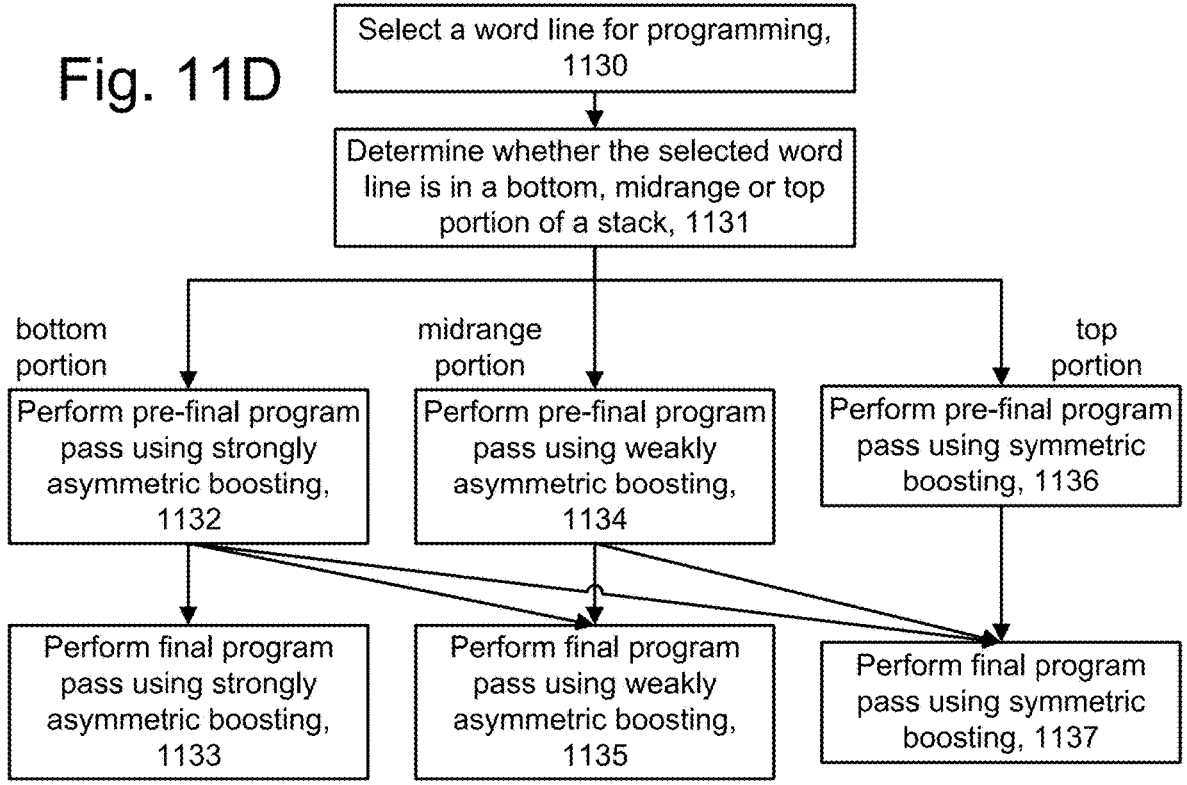
FIG. 11D depicts an example process for performing a multi-pass program operation using strongly asymmetric boosting, weakly asymmetric boosting or symmetric boosting, depending on a position of the selected word line in a stack.

FIG. 11D depicts an example process for performing a multi-pass program operation using strongly asymmetric boosting, weakly asymmetric boosting or symmetric boosting, depending on a position of the selected word line in a stack. See also FIG. 15B. Step 1130 includes selecting a word line WLn for programming. Step 1131 includes determining whether the selected word line is in a bottom, midrange or top portion of a stack. In the stack 610 of FIG. 5A, for example, the bottom, midrange and top portions of the stack can include an approximately equal number of word lines, e.g., each portion can include about one third of the word lines. For example, the bottom, midrange and top portions can include WL0-WL3, WL4-WL6 and WL7-WL9, respectively. The midrange portion includes the midpoint word line of the stack.

If WLn is in the bottom portion, step 1132 includes performing a pre-final program pass using strongly asymmetric boosting and, subsequently, step 1133 includes performing a final program pass using strongly asymmetric boosting, step 1135 includes performing a final program pass using weakly asymmetric boosting, or step 1137 includes performing a final program pass using symmetric boosting. If WLn is in the midrange portion, step 1134 includes performing a pre-final program pass using weakly asymmetric boosting and, subsequently, step 1135 or 1137 is reached. If WLn is in the top portion, step 1136 includes performing a pre-final program pass using symmetric boosting and, subsequently, step 1137 is reached.

In the strongly asymmetric boosting of the pre-final program pass, the drain side pass voltage is less than the source side pass voltage by a relatively larger amount, e.g., more than 25%. In the weakly asymmetric boosting of the pre-final program pass, the drain side pass voltage is less than the drain side pass voltage by a moderate amount, e.g., about 10-25%. In the symmetric boosting of the pre-final program pass, the drain side pass voltage is equal to or within +/−10% of the source side pass voltage. The above value are examples. In the pre-final program pass, the source side pass voltage is greater than the drain side pass voltage by a larger amount in the strongly asymmetric boosting compared to the weakly asymmetric boosting, and the source side pass voltage is greater than the drain side pass voltage by a larger amount in the weakly asymmetric boosting compared to the symmetric boosting.

In the strongly asymmetric boosting of the final program pass, the source side pass voltage is less than the drain side pass voltage by a relatively larger amount, e.g., more than 25%. In the weakly asymmetric boosting of the final program pass, the source side pass voltage is less than the drain side pass voltage by a moderate amount, e.g., about 10-25%. In the symmetric boosting of the final program pass, the source side pass voltage is equal to or within +/−10% of the drain side pass voltage. The above value are examples. In the pre-final program pass, the drain side pass voltage is greater than the source side pass voltage by a larger amount in the strongly asymmetric boosting compared to the weakly asymmetric boosting, and the drain side pass voltage is greater than the source side pass voltage by a larger amount in the weakly asymmetric boosting compared to the symmetric boosting.

Figure 11E:
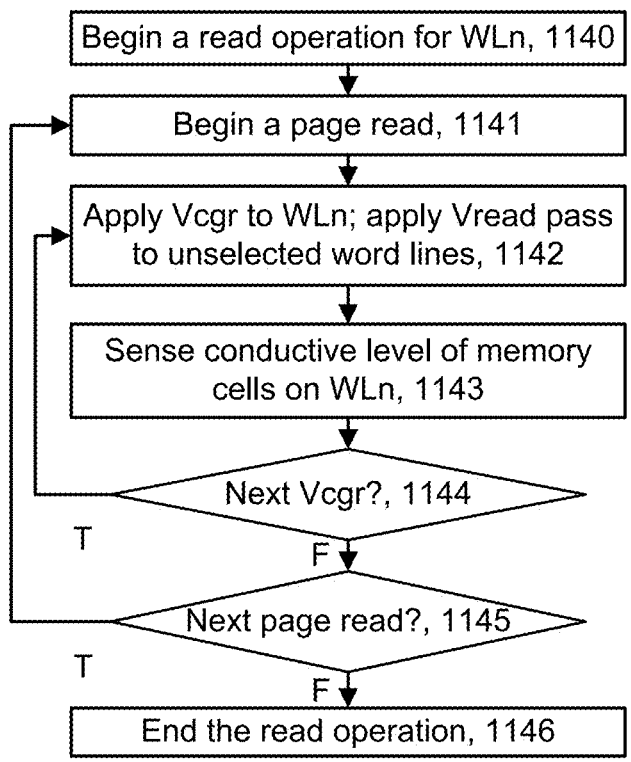
FIG. 11E depicts an example process for performing a read operation.

FIG. 11E depicts an example process for performing a read operation. Step 1140 begins a read operation. The read operation can involve reading one or more pages of data, for example. Reading a page can involve sensing the conductive level of the memory cells for each of one or more control gate read voltages (Vcgr) which are applied to the selected word line WLn. Step 1141 begins a page read for a first page of data. Step 1142 includes applying Vcgr to WLn and concurrently applying a read pass voltage, Vread pass, to the unselected word lines. Vread pass may be equal to or within +/−10% of the pass voltage, Vpass_high, which is applied during a program pulse. Vread pass is high enough to provide the unselected memory cells in a strongly conductive state so that the selected memory cell can be sensed. See FIG. 12C, for example, which involves a read operation for three pages of data consistent with FIG. 7C. Vcgr may be first set to VrD, for example. Step 1143 includes sensing a conductive level of the memory cells on WLn.

A decision step 1144 determines if there is a next Vcgr in the page read. If the decision step 1144 is true, step 1142 is repeated with the next Vcgr of the page read. If the decision step 1144 is false, a decision step 1145 is reached. The decision step 1145 determines whether there is a next page read in the read operation. If the decision step 1145 is true, step 1141 is repeated by beginning a next page read. If the decision step 1145 is false, the read operation ends at step 1146.

FIG. 12A depicts example waveforms in a program loop of a first or other pre-final program pass, consistent with step 1100 of the program process of FIG. 11A. In FIG. 12A-12C, the vertical axis depicts voltage and the horizontal axis depicts time. The program loop includes a program portion from t0-t3 and a verify portion from t4-t9. In the program portion, a plot 1200 represents VWLn, the voltage applied to the selected word line. A plot 1201 represents Vpass_high and a plot 1202 represents Vpass_low. Plots 1201 and 1202 are voltage signals applied to unselected word lines while a program pulse is applied to the selected word line. Vpass_low or Vpass_high may be applied to the adjacent word lines of WLn as described herein to encourage or discourage electron injection in the charge-trapping layer of a NAND string between WLn−1 and WLn. Vpass_high may be applied to the remaining unselected word lines, in one approach. As mentioned, Vpass_low may be more than 25% lower than Vpass_high, and even 30-40% lower. In one example, Vpass_high=10 V and Vpass_low=6 V.

VWLn can increase in a first step to a pass voltage level and then to a peak level in a second step. For example, VWLn and the pass voltages of the unselected word lines can increase starting at t0. VWLn can then step up again at t1. VWLn and the pass voltages ramp back down to 0 V, for example, at t2 and t3, respectively.

A read pass voltage signal 1210 is applied to the unselected word lines at t4 during a verify phase of the program loop. A voltage signal 1211 of WLn with a level of VvINT is applied to the selected word line at t6. A verify test is performed at t7 to determine whether the memory cells are in a conductive state and therefore have a Vth<VvINT or a non-conductive state and therefore have a Vth>=VvINT.

FIG. 12B depicts example waveforms in a program loop of a second or other final program pass, consistent with step 1103 of the program process of FIG. 11A. The program loop includes a program portion from t0-t3 and a verify portion from t4-t15. In the program portion, a plot 1230 represents VWLn, the voltage applied to the selected word line. A plot 1231 represents Vpass_high and a plot 1232 represents Vpass_low. Plots 1231 and 1232 are voltage signals applied to unselected word lines while a program pulse is applied to the selected word line. Vpass_low or Vpass_high may be applied to the adjacent word lines of WLn as described herein In the verify portion of the program loop, a voltage signal 1220 having a magnitude of Vread pass is applied to the unselected word lines while a voltage signal 1221 is applied to the selected word line. The voltage signal 1221 includes the verify voltages of each programmed data state, e.g., VvA-VvG, as an example. Verify tests are performed at t7-t13 using the verify voltages VvA-VvG, respectively, to determine whether the memory cells are in a conductive state.

FIG. 12C depicts example waveforms in a read operation, consistent with the read process of FIG. 11E. This example involves reading three pages of data. A first, lower page is read on WLn using Vcgr=VrD at t1 (voltage signal 1241). A voltage signal 1240 with a magnitude of Vread pass is ramped up on the unselected word lines starting at t0 and ramped down starting at t2. A second, middle page is read on WLn using Vcgr=VrB at t5 and Vcgr=VrF at t6 (voltage signal 1251). A voltage signal 1250 with a magnitude of Vread pass is ramped up on the unselected word lines starting at t3 and ramped down starting at t7. A third, upper page is read on WLn using Vcgr=VrA at t9, Vcgr=VrC at t10, Vcgr=VrE at t11 and Vcgr=VrG at t12 (voltage signal 1261). A voltage signal 1260 with a magnitude of Vread pass is ramped up on the unselected word lines starting at t8 and ramped down starting at t13.

FIG. 13 depicts example voltages applied to the word lines of a block in a two pass program operation, consistent with steps 2-5 of the block of FIG. 6A and the program process of FIG. 11A. In this example, a selected word line, WLn, is WL1, a source side adjacent word line, WLn−1, is WL0 and a drain side adjacent word line, WLn+1, is WL2.

Step 2 represents a first program pass for WLn, consistent with step 1100 of FIG. 11A. Vpass_high is applied to WL0 and WL3-WL9, Vpgm is applied to WL1 and Vpass_low is applied to WL2. Step 3 represents a second program pass for WLn−1, consistent with step 1101 of FIG. 11A. Vpgm is applied to WL0 and Vpass_high is applied to WL1-WL9. Step 4 represents a first program pass for WLn+1, consistent with step 1102 of FIG. 11A. Vpass_high is applied to WL0, WL1, and WL4-WL9, Vpgm is applied to WL2 and Vpass_low is applied to WL3. Step 5 represents a second program pass for WLn, consistent with step 1103 of FIG. 11A. Vpass_low is applied to WL0, Vpgm is applied to WL1 and Vpass_high is applied to WL2-WL9.

FIG. 14A depicts a plot of Vth width versus data state, comparing the process of FIG. 11A (dashed line) with a comparative example (solid line). The Vth width is reduced especially for lower data states, such as the Er, A and B states, which are most susceptible to widening of the Vth distribution due to neighbor word line interference and program disturb. The widening occurs due to an increase in the upper tail of the Vth distribution as depicted in FIG. 7C. Some benefits can also be realized for higher data states. The Vth width is reduced by biasing the unselected word lines to encourage electron injection between WLn−1 and WLn in a pre-final program pass of a multi-pass program operation, and to discourage this electron injection in a final program pass of the multi-pass program operation.

FIG. 14B depicts a plot of data state or Vth versus a final Vpgm, comparing the process of FIG. 11A with a comparative example. The final Vpgm is the Vpgm in the final program loop of a program pass. The final Vpgm can be relatively high when the pass voltages of the adjacent word lines are relatively lower. This is because the fringing field of the pass voltage signals helps program the selected memory cells. That is, a memory cell is programmed with a program speed which is based on sum of the program voltage and the adjacent pass voltages. Also, a higher final Vpgm can result in more program disturb. The techniques described herein address these issues. In one approach, a relatively high pass voltage on one adjacent word line of the selected word line is offset by a relatively low pass voltage on the other adjacent word line of the selected word line. Although, even with this offset, the final Vpgm may be higher (dashed line) compared to the case of using a relatively high pass voltage on both adjacent word lines of the selected word line (solid line). The time penalty of using one or two additional program loop, for instance, can be an acceptable tradeoff for the benefit of a narrower Vth distribution.

The plot shows that Vpgm final has a particular magnitude when the programming of memory cells to a given data state is completed in a program pass. A higher Vpgm final is used to complete the programming of higher-state memory cells. The data states range from the A state to the G state, as an example, on the vertical axis. For a given data state, Vpgm final is smaller or larger as shown by the solid or dashed lines, respectively. As an example, Vpgm final may range from 15-20 V.

FIG. 15A depicts a plot of a selected word line position in a stack versus a pass voltage, consistent with the process of FIG. 11C, where the stack is divided into two portions. In FIGS. 15A and 15B, the vertical axis depicts a position of a selected word line (WLn) in the stack, along the height or z axis. In the stack 610 of FIG. 5A, for example, the word lines extend from a bottom of the stack to a top of the stack, and WL5 is at the midpoint of the stack. A bottom portion of the stack can include the word lines at or below the midpoint (e.g., WL0-WL5), and a top portion of the stack can include the word lines at or above the midpoint (e.g., WL6-WL9). In this example, WL9 is the drain side data word line (WL), which is also the topmost data word line in the stack. WL0 is the source side data word line, which is also the bottommost data word line in the stack.

For a 2D NAND string, the top, midrange and bottom portions can be replaced by respective drain, midrange and source side portions.

In FIGS. 15A and 15B, the horizontal axis depicts a pass voltage for adjacent word lines of the selected word line. In FIG. 15A, a bottom portion 1520, midpoint 1521 and top portion 1522 are depicted. In FIG. 15B, a bottom portion 1530, midpoint 1531, midrange portion 1532 and top portion 1533 are depicted. A plot 1501 indicates a relatively high pass voltage of Vpass_high, e.g., 10 V, when WLn is in the bottom or top portion of the stack. A plot 1500 indicates a relatively low pass voltage of Vpass_low, e.g., 6 V, when WLn is in the bottom portion of the stack. In this example, Vpass_low is 40% lower than Vpass_high. In some embodiments, Vpass_low is more than 25% lower than Vpass_high, or at least more than 10% lower than Vpass_high. In one option, a plot 1502 indicates that a pass voltage between Vpass_low and Vpass_high, such as 9 V, is used when WLn is in the top portion of the stack.

In one example, in a second or other final program pass, the source side pass voltage is represented by plot 1500 when WLn is in the bottom portion and by plot 1501 or 1502 when WLn is in the top portion.

FIG. 15B depicts a plot of a selected word line position in a stack versus a pass voltage, consistent with the process of FIG. 11D, where the stack is divided into three portions. Setting the pass voltages differently for each of three portions of the stack allows for a transition from Vpass_low to Vpass_high via an intermediate level of Vpass_int. A bottom portion of the stack can include word lines below the midpoint (e.g., WL0-WL3), a midrange portion of the stack can include a set of word lines (e.g., WL4-WL6) which include the midpoint word line WL5, and a top portion of the stack can include the word lines above the midpoint (e.g., WL7-WL9). Each portion can include about one third of the data word lines. Generally, with N portions, each portion can include about 1/N of the word lines.

A plot 1512 indicates a relatively high pass voltage of Vpass_high, e.g., 10 V, when WLn is in the bottom, midrange or top portion of the stack. A plot 1510 indicates a relatively low pass voltage of Vpass_low, e.g., 6 V, when WLn is in the bottom portion of the stack. A plot 1511 indicates an intermediate pass voltage of Vpass_int, e.g., 6 V, when WLn is in the midrange portion of the stack, where Vpass_low<Vpass_int<Vpass_high. In this example, Vpass_int is 20% lower than Vpass_high, and Vpass_low is 40% lower than Vpass_high. In some embodiments, Vpass_low is more than 25% lower than Vpass_high, and Vpass_int is between 10-25% lower than Vpass_high. In one option, a plot 1513 indicates that a pass voltage between Vpass_int and Vpass_high, such as 9 V, is used when WLn is in the top portion of the stack.

In one example, in a second or other final program pass, the source side pass voltage is represented by plot 1510 when WLn is in the bottom portion, by plot 1511 when WLn is in the midrange portion, and by plot 1513 or 1512 when WLn is in the top portion.

FIG. 15C depicts a plot showing a variation in Vpass_high as a function of a number of program erase (P-E) cycles, consistent with FIGS. 15A and 15B. When the number of P-E cycles increases for a set of memory cells, it is easier for neighbor word line interference and program disturb to occur. Accordingly, the pass voltages can be adjusted to counteract this effect. In one approach, Vpass_high is reduced when the number of P-E cycles is greater than a threshold number of P-E cycles, PEt. For example, Vpass_high may be reduced by at least 10%, e.g., from 10 V to 9 V, when the number of P-E cycles is greater than PEt. This helps reduce neighbor word line interference and program disturb. The number of P-E cycles can be tracked for a block or other unit of memory cells.

In one example, in a first or other pre-final program pass, the source side pass voltage is reduced from Vpass_high1 to Vpass_high2 when WLn is in the bottom portion of the stack. The source side pass voltage (a first pass voltage) is lower when a number of program-erase cycles for a set of memory cells is above a threshold than when the number of program-erase cycles for the set of memory cells is below the threshold.

FIG. 16A is a table depicting different cases of pass voltages in first and second program passes. During the program pulse on WLn, Vpass_source is the voltage applied to WLn−1 and Vpass_drain is the voltage applied to WLn+1. Vpass_s/d is a shorthand notation for Vpass_source/

Vpass_drain. The first program pass is a pre-final program pass and the second program pass is a final program pass.

For case 1, in the first program pass, Vpass_s/d=high/high and in the second program pass, Vpass_s/d=high/high. This case can result in the fastest programming in both the first and second program passes since the fringing field experienced by the memory cells of WLn is maximized.

For case 2, in the first program pass, Vpass_s/d=low/high and in the second program pass, Vpass_s/d=low/high. This case reduces electron injection between WLn and WLn−1 in the second program pass to reduce neighbor word line interference of the memory cells of WLn−1.

For case 3, in the first program pass, Vpass_s/d=high/low and in the second program pass, Vpass_s/d=high/high. This case increases electron injection between WLn and WLn−1 in the first program pass to reduce neighbor word line interference of the memory cells of WLn−1 in the second program pass.

For case 4, in the first program pass, Vpass_s/d=high/low and in the second program pass, Vpass_s/d=low/high. This case increases electron injection between WLn and WLn−1 in the first program pass, and reduces electron injection between WLn and WLn−1 in the second program pass, to reduce neighbor word line interference of the memory cells of WLn−1. This case is consistent with FIGS. 10C and 10D.

For case 5, in the first program pass, Vpass_s/d=low/low and in the second program pass, Vpass_s/d=high/high. This case tends to result in a large amount electron injection in the second pass.

For case 6, in the first program pass, Vpass_s/d=low/low and in the second program pass, Vpass_s/d=low/high. This case reduces electron injection between WLn and WLn−1 in the second program pass to reduce neighbor word line interference of the memory cells of WLn−1.

FIG. 16B is a table indicating how the number of electrons injected between WLn and WLn−1 varies in the first and second program passes for the different cases of FIG. 16A. Generally, the number of electrons drawn into the charge-trapping layer between WLn−1 and WLn in the second program pass is a function of a sum of the final Vpgm on WLn and the Vpass on WLn−1 in the second program (SUM2) pass minus a sum of the final Vpgm on WLn and the Vpass on WLn−1 in the first program pass (SUM1). A goal is to maximize SUM1 and minimize SUM2 so that the metric of SUM2-SUM1 is minimized. This minimizes the number of electrons drawn into the charge-trapping layer between WLn−1 and WLn in the second program pass, and thus minimizes the Vth widening. For the first pass, the table depicts the pass voltages for the source and drain side word lines (Vpass_s/d), a corresponding Vpgm final and SUM1. Similarly, for the second pass, the table depicts Vpass_s/d, Vpgm final and SUM2. The last column depicts SUM2-SUM1. The values are in Volts and are examples, where Vpass_low=6 V and Vpass_high=10 V. Vpgm_final in the first and second program passes is lower when Vpass_s/d is higher.

In the first program pass, for case 1, Vpgm_final is the lowest value among the cases at 14 V since the pass voltages are the highest, and SUM1=10+14=24 V. For cases 2-4, Vpgm final=15 V and for cases 5 and 6, Vpgm final=16 V. For case 2, SUM1=6+15=21 V. For cases 3 and 4, SUM1=10+15=25 V. For cases 5 and 6, SUM1=6+16=22 V.

In the second program pass, for cases 1, 3 and 5, Vpgm final=20 V and SUM2=10+20=30 V. For cases 2, 4 and 6, Vpgm final=21 V and SUM2=6+21=27 V. Finally, SUM2-SUM1=6 V for cases 1 and 2, 5 V for cases 3 and 6 V, 2 V for case 4 and 8 V for case 5. Case 4 thus is the best case for reducing neighbor word line interference. However, as mentioned, other considerations such program disturb based on the selected word line position in the stack should be considered when determining the optimal pass voltages.

In one implementation, an apparatus comprises: a vertically-extending NAND string in a stack, the stack comprising alternating conductive and dielectric layers; a plurality of word lines connected to a set of memory cells in the NAND sting; means for performing asymmetric boosting of a channel of the NAND string during a final program pass of a multi-pass program operation when a selected word line of the plurality of word lines is in a bottom portion of the stack; and means for performing symmetric boosting of the channel of the NAND string during a final program pass of the multi-pass program operation when the selected word line of the plurality of word lines is in a top portion of the stack.

The apparatus may further comprise: means for performing asymmetric boosting of the channel of the NAND string during a pre-final program pass of the multi-pass program operation when the selected word line of the plurality of word lines is in the bottom portion of the stack; and means for performing symmetric boosting of the channel of the NAND string during a pre-final program pass of the multi-pass program operation when the selected word line of the plurality of word lines is in the top portion of the stack.

The means for performing asymmetric or symmetric boosting may include the control circuitry 110, the controller 122, the power control module 116, including the WLn driver 443, the WLn+1 driver 444, the WLn−1 driver 445 of FIG. 3, the row decoder 124 or other logic hardware, and/or other executable code stored on a computer readable storage medium or device. Other embodiments may include similar or equivalent means.

The apparatus may further include: means for performing asymmetric boosting of the channel of the NAND string during a pre-final program pass of the multi-pass program operation when the selected word line of the plurality of word lines is in the bottom portion of the stack; and means for performing symmetric boosting of the channel of the NAND string during a pre-final program pass of the multi-pass program operation when the selected word line of the plurality of word lines is in the top portion of the stack.

The means for performing asymmetric or symmetric boosting may be as discussed above.

In the asymmetric boosting of the final program pass: a pass voltage (e.g., e.g., 10 V as in FIG. 15B, plot 1512 and 1513) of an adjacent drain side word line of the selected word line is greater than a pass voltage (e.g., 6, 8 or 9-10 V as in plots 1510, 1511 and 1513, respectively) of an adjacent source side word line of the selected word line by a first, second or third amount (4 V, 2 V or 0-1 V) when the selected word line is in the bottom portion 1530 of the stack, a midrange portion 1532 of the stack, or the top portion 1533 of the stack, respectively. The first amount is greater than the second amount; and the second amount is greater than the third amount.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
a set of memory cells arranged in a NAND string and connected to a plurality of word lines, the NAND string extends vertically in a stack comprising alternating conductive and dielectric layers; and
a control circuit, the control circuit is configured to program a selected memory cell of the set of memory cells in a pre-final program pass, subsequently program a source side memory cell adjacent to the selected memory cell in a final program pass, and subsequently program the selected memory cell in a final program pass;
in the pre-final program pass of the selected memory cell, the control circuit is configured to apply a first pass voltage to the source side memory cell while applying a program voltage to the selected memory cell;
in the final program pass of the selected memory cell, the control circuit is configured to apply a second pass voltage to the source side memory cell while applying a program voltage to the selected memory cell; and
the second pass voltage is lower than the first pass voltage when the selected memory cell is in a bottom portion of the stack.

2. The apparatus of claim 1, wherein:
the second pass voltage is more than 10% lower than the first pass voltage when the selected memory cell is in the bottom portion of the stack; and
the second pass voltage is within +/−10% of the first pass voltage when the selected memory cell is in a top portion of the stack.

3. The apparatus of claim 1, wherein:
the second pass voltage is lower than the first pass voltage by a first amount when the selected memory cell is in the bottom portion of the stack; and
the second pass voltage is lower than the first pass voltage by a second amount which is less than the first amount when the selected memory cell is at a midpoint of stack.

4. The apparatus of claim 1, wherein:
the second pass voltage is more than 25% lower than the first pass voltage when the selected memory cell is in the bottom portion of the stack; and
the second pass voltage is less than 25% lower the first pass voltage when the selected memory cell is at a midpoint of stack.

5. The apparatus of claim 4, wherein:
the second pass voltage is within +/−10% of the first pass voltage when the selected memory cell is in a top portion of the stack.

6. The apparatus of claim 1, wherein:
in the pre-final program pass of the selected memory cell, and in the final program pass of the selected memory cell, the control circuit is configured to apply a read pass voltage to the source side memory cell while applying a verify voltage to the selected memory cell;
the read pass voltage is within +/−10% of the first pass voltage; and
the second pass voltage is more than 25% lower than the read pass voltage.

7. The apparatus of claim 1, wherein:
in the pre-final program pass of the selected memory cell, the control circuit is configured to apply a third pass voltage to a drain side memory cell adjacent to the selected memory cell while applying the program voltage to the selected memory cell;
in the final program pass of the selected memory cell, the control circuit is configured to apply a fourth pass voltage to the drain side memory cell while applying the program voltage to the selected memory cell; and
the fourth pass voltage is higher than the third pass voltage when the selected memory cell is in the bottom portion of the stack.

8. The apparatus of claim 7, wherein:
the third pass voltage is lower than the first pass voltage and the fourth pass voltage is higher than the second pass voltage when the selected memory cell is in the bottom portion of the stack.

9. The apparatus of claim 1, wherein:
the first pass voltage is lower when a number of program-erase cycles for the set of memory cells is above a threshold than when the number of program-erase cycles for the set of memory cells is below the threshold.

10. The apparatus of claim 1, wherein:
an amount by which the second pass voltage is lower in the final program pass than in the pre-final program pass is relatively high when a position of the selected memory cell in the stack is relatively low.

11. A method, comprising:
programming a set of memory cells connected to a selected word line in a first program pass, the programming in the first program pass comprises applying a program voltage to the selected word line while applying a source side pass voltage to a source side word line which is adjacent to the selected word line and while applying a drain side pass voltage to a drain side word line which is adjacent to the selected word line;
programming the set of memory cells in a second program pass which is after the first program pass, the programming in the second program pass comprises applying a program voltage to the selected word line while applying a source side pass voltage to the source side word line and while applying a drain side pass voltage to the drain side word line; and
programming memory cells connected to the source side word lines before the first program pass and between the first program pass and the second program pass, wherein the source side pass voltage is lower in the second program pass than in the first program pass.

12. The method of claim 11, wherein:
the drain side pass voltage is lower in the first program pass than in the second program pass.

13. The method of claim 11, wherein:
the set of memory cells are arranged in vertically extending NAND strings in a stack; and
an amount by which the source side pass voltage is lower in the second program pass than in the first program pass is relatively high when a position of the selected word line in the stack is relatively low.

14. The method of claim 13, wherein:
the stack comprises a bottom portion, a midrange portion and a top portion;
the amount is greater when the position of the selected word line is in the bottom portion than when the position of the selected word line is in the midrange portion; and
the amount is greater when the position of the selected word line is in the midrange portion than when the position of the selected word line is in the top portion.

15. The method of claim 11, further comprising:

applying a read pass voltage to the source side word line while applying a verify voltage to the selected word line;

the read pass voltage is within +/−10% of the source side pass voltage in the first program pass; and the source side pass voltage in the second program pass is more than 25% lower than the read pass voltage.

16. An apparatus, comprising:

a vertically-extending NAND string in a stack, the stack comprising alternating conductive and dielectric layers;

a plurality of word lines connected to a set of memory cells in the NAND sting;

means for performing asymmetric boosting of a channel of the NAND string during a final program pass of a multi-pass program operation when a selected word line of the plurality of word lines is in a bottom portion of the stack; and means for performing symmetric boosting of the channel of the NAND string during a final program pass of the multi-pass program operation when the selected word line of the plurality of word lines is in a top portion of the stack, wherein:

in the asymmetric boosting of the final program pass, a pass voltage of an adjacent source side word line of the selected word line is more than 10% lower than a pass voltage of an adjacent drain side word line of the selected word line; and in the symmetric boosting of the final program pass, the pass voltage of the adjacent source side word line is within +/−10% of the pass voltage of the adjacent drain side word line.

17. The apparatus of claim 16, further comprising:

means for performing asymmetric boosting of the channel of the NAND string during a pre-final program pass of the multi-pass program operation when the selected word line of the plurality of word lines is in the bottom portion of the stack; and means for performing symmetric boosting of the channel of the NAND string during a pre-final program pass of the multi-pass program operation when the selected word line of the plurality of word lines is in the top portion of the stack.

18. The apparatus of claim 17, wherein:

in the asymmetric boosting of the pre-final program pass, a pass voltage of an adjacent drain side word line is more than 10% lower than a pass voltage of an adjacent source side word line; and in the symmetric boosting of the pre-final program pass, the pass voltage of the adjacent source side word line is within +/−10% of the pass voltage of the adjacent drain side word line.

19. The apparatus of claim 16, wherein in the asymmetric boosting of the final program pass:

the pass voltage of the adjacent drain side word line of the selected word line is greater than the pass voltage of the adjacent source side word line of the selected word line by a first, second or third amount when the selected word line is in the bottom portion of the stack, a midrange portion of the stack, or the top portion of the stack, respectively;

the first amount is greater than the second amount; and the second amount is greater than the third amount.

* * * * *